(12) United States Patent
Robibero et al.

(10) Patent No.: US 11,479,444 B2
(45) Date of Patent: Oct. 25, 2022

(54) METHOD AND DEVICE FOR DETECTING NON-UNIFORM AND UNIFORM DETERIORATIONS IN A SUSPENSION MEMBER ARRANGEMENT FOR AN ELEVATOR BASED ON AC VOLTAGE MEASUREMENTS

(71) Applicant: Inventio AG, Hergiswil (CH)

(72) Inventors: Vincent Robibero, Randolph, NJ (US); Philippe Henneau, Zürich (CH)

(73) Assignee: INVENTIO AG, Hergiswil NW (CH)

( * ) Notice: Subject to any disclaimer, the term of this patent is extended or adjusted under 35 U.S.C. 154(b) by 1109 days.

(21) Appl. No.: 16/077,255

(22) PCT Filed: Feb. 2, 2017

(86) PCT No.: PCT/EP2017/052281
§ 371 (c)(1),
(2) Date: Aug. 10, 2018

(87) PCT Pub. No.: WO2017/137307
PCT Pub. Date: Aug. 17, 2017

(65) Prior Publication Data
US 2019/0047823 A1  Feb. 14, 2019

(30) Foreign Application Priority Data

Feb. 11, 2016 (EP) ...................................... 16155357
Feb. 11, 2016 (EP) ...................................... 16155358
Jul. 28, 2016 (EP) ................... PCT/EP2016/067966

(51) Int. Cl.
*B66B 7/12* (2006.01)
*D07B 1/14* (2006.01)
(Continued)

(52) U.S. Cl.
CPC .............. *B66B 7/1223* (2013.01); *B66B 5/00* (2013.01); *B66B 5/0018* (2013.01); *B66B 7/062* (2013.01);
(Continued)

(58) Field of Classification Search
CPC ....... B66B 7/1223; B66B 5/00; B66B 5/0018; B66B 7/062; B66B 7/085; B66B 7/1215;
(Continued)

(56) References Cited

U.S. PATENT DOCUMENTS 4,929,897 A   5/1990  Van Der Walt
7,123,030 B2  10/2006  Robar et al.
(Continued)

FOREIGN PATENT DOCUMENTS

CN   103068711 A   4/2013
CN   105073618 A   11/2015
(Continued)

OTHER PUBLICATIONS

Lei, Huaming et al. "Health Monitoring for Coated Steel Belts in an Elevator System." Journal of Sensors vol. 2012, Article ID 750261, 5 pages, http://dx.doi.org/10.1155/2012/750261.

*Primary Examiner* — Jeffrey Donels
(74) *Attorney, Agent, or Firm* — William J. Clemens; Shumaker, Loop & Kendrick, LLP

(57) ABSTRACT

A method and device detect non-uniform and uniform deterioration states in an elevator suspension member having first and second groups of electrically conductive cords. First ends of the groups are electrically connected to an alternating voltage generator arrangement and second ends are electrically connected to each other through first and second resistors via a neutral point at which electrical resistances of the groups are the same in a non-deteriorated state of the suspension member. The method includes:
(Continued)

applying first and second alternating voltages to the first end of the first and second groups, respectively; determining a neutral point voltage between the neutral point and an electrical reference potential; determining difference voltages between first and second difference measurement points located between the second ends of the groups and the respective resistors; and determining the deterioration state based on both the determined neutral point voltage and the determined difference voltage.

11 Claims, 13 Drawing Sheets

(51) Int. Cl.
| | | |
|---|---|---|
| *B66B 7/08* | (2006.01) | |
| *B66B 19/00* | (2006.01) | |
| *G01R 31/00* | (2006.01) | |
| *B66B 5/00* | (2006.01) | |
| *G01R 31/317* | (2006.01) | |
| *G01R 31/08* | (2020.01) | |
| *B66B 7/06* | (2006.01) | |
| *G01M 5/00* | (2006.01) | |
| *G01N 27/20* | (2006.01) | |

(52) U.S. Cl.
CPC ............ *B66B 7/085* (2013.01); *B66B 7/1215* (2013.01); *B66B 19/007* (2013.01); *D07B 1/145* (2013.01); *G01M 5/0033* (2013.01); *G01M 5/0091* (2013.01); *G01N 27/20* (2013.01); *G01R 31/008* (2013.01); *G01R 31/081* (2013.01); *G01R 31/31723* (2013.01); *D07B 2501/2007* (2013.01); *D10B 2401/16* (2013.01); *G01R 31/08* (2013.01)

(58) Field of Classification Search
CPC .................. B66B 19/007; D07B 1/145; D07B 2501/2007; G01M 5/0033; G01M 5/0091; G01N 27/20; G01R 31/31723; G01R 31/08; D10B 2401/16
See application file for complete search history.

(56) References Cited

U.S. PATENT DOCUMENTS

| | | | | |
|---|---|---|---|---|
| 8,011,479 | B2* | 9/2011 | Stucky | .................. B66B 7/1223 |
| | | | | 187/391 |
| 8,424,653 | B2 | 4/2013 | Stucky et al. | |
| 2002/0194935 | A1* | 12/2002 | Clarke | .................. B66B 7/1223 |
| | | | | 73/862.391 |
| 2008/0223668 | A1 | 9/2008 | Stucky et al. | |
| 2011/0284331 | A1 | 11/2011 | Stucky et al. | |
| 2013/0207668 | A1* | 8/2013 | Fargo | ................... G01N 27/046 |
| | | | | 324/705 |
| 2014/0182974 | A1* | 7/2014 | Puranen | ................ B66B 7/1223 |
| | | | | 187/247 |
| 2015/0336769 | A1* | 11/2015 | Dold | ....................... B66B 7/062 |
| | | | | 187/393 |
| 2015/0362450 | A1* | 12/2015 | Lehtinen | ................ G01N 27/20 |
| | | | | 187/391 |
| 2015/0375963 | A1 | 12/2015 | Sun et al. | |
| 2016/0002006 | A1* | 1/2016 | Sun | ........................ G01R 17/00 |
| | | | | 187/254 |
| 2016/0229667 | A1* | 8/2016 | Cereghetti | ............ B66B 7/1223 |
| 2017/0029249 | A1* | 2/2017 | Robibero | .................. B66B 5/00 |
| 2017/0334677 | A1* | 11/2017 | Dold | ......................... G01L 5/10 |

FOREIGN PATENT DOCUMENTS

| | | |
|---|---|---|
| DE | 19708518 A1 | 10/1998 |
| EP | 1730066 B1 | 10/2010 |
| EP | 1732837 B1 | 4/2011 |
| JP | S54107038 A | 8/1979 |
| WO | 2011098847 A1 | 8/2011 |
| WO | 2013135285 A1 | 9/2013 |

* cited by examiner

29 DETERMINATION UNIT
31 FIRST VOLTAGE MEASUREMENT ARRANGEMENT
33 SECOND VOLTAGE MEASUREMENT ARRANGEMENT

29 DETERMINATION UNIT
31 FIRST VOLTAGE MEASUREMENT ARRANGEMENT
33 SECOND VOLTAGE MEASUREMENT ARRANGEMENT

METHOD AND DEVICE FOR DETECTING NON-UNIFORM AND UNIFORM DETERIORATIONS IN A SUSPENSION MEMBER ARRANGEMENT FOR AN ELEVATOR BASED ON AC VOLTAGE MEASUREMENTS

CROSS-REFERENCE TO RELATED APPLICATIONS

The present invention claims the priorities of EP 16155357.3 and EP 16155358.1 (hereinafter referred to as "the priority documents").

FIELD

The present invention relates to a method for detecting a deterioration state in a suspension member arrangement for an elevator.

BACKGROUND

Elevators typically comprise a car and, optionally, a counterweight which may be displaced for example within an elevator shaft or hoistway to different levels in order to transport persons or items for example to various floors within a building. In a common type of elevator, the car and/or the counterweight are supported by a suspension member arrangement comprising one or more suspension members. A suspension member may be a member which may carry heavy loads in a tension direction and which may be bent in a direction transverse to the tension direction. For example, a suspension member may be a rope or a belt. Typically, suspension members comprise a plurality of load carrying cords. The cords may be made for example with an electrically conductive material, particularly a metal such as steel.

During operation of the elevator, suspension members have to carry high loads and are typically repeatedly bent when running along for example a traction sheave, a pulley and/or other types of sheaves. Accordingly, substantial physical stress is applied to the suspension member arrangement during operation which may lead to deteriorations in the suspension members' physical characteristics such as e.g. their load bearing capability.

However, as elevators may typically be used by people for transportation along significant heights, safety requirements have to be fulfilled. For example, it has to be safeguarded that the suspension member arrangement can always guarantee safe support of the car and/or the counterweight. For such purposes, safety regulations rule for example that any substantial deterioration of an initial load bearing capacity of a suspension member arrangement can be detected such that for example counter-measures such as replacing a substantially deteriorated or faulty suspension member from the suspension member arrangement may be initiated.

Generally, a load bearing capacity of a suspension member may be specified when designing the suspension member and may then be physically tested upon completion of a fabrication of the suspension member. Physical tests may comprise for example tensile loading of the suspension member and measuring the suspension member's reaction to an application of high tensile forces.

However, during actual operation of the elevator, it may be difficult or even impossible to perform such physical tests. With conventional steel ropes serving as suspension members, visual checking of a rope condition has been possible. However, in modern suspension members, load bearing cords are typically enclosed in a coating or matrix and are therefore not visible from outside. Therefore, alternative approaches for determining a load bearing capacity in a suspension member arrangement or determining parameters related thereto have been developed.

For example, elevator load bearing member wear and failure detection has been described in EP 1 730 066 B1. A method and apparatus for detecting elevator rope degradation using electrical resistance is described in U.S. Pat. No. 7,123,030 B2. Electrical signal application strategies for monitoring a condition of an elevator load bearing member are described in US 2011/0284331 A1 and U.S. Pat. No. 8,424,653 B2. Electrical signal application strategies for monitoring a condition of an elevator load bearing member are described in US 2008/0223668 A1 and U.S. Pat. No. 8,011,479 B2. A simplified resistance based belt type suspension inspection is disclosed in US 2013/0207668 A1. An elevator system belt type suspension having connecting devices attached thereto is described in WO 2011/098847 A1. A method for detection of wear or failure in a load bearing member of an elevator is described in WO 2013/135285 A1. Electrical signal application strategies for monitoring a condition of an elevator load bearing member are described in EP 1 732 837 B1. "Health Monitoring for Coated Steel Belts in an Elevator System" have been described in a research article of Huaming Lei et al. in the Journal of Sensors, Volume 2012, Article ID 750261, 5 pages, doi: 10.1155/2012/750261. Most of these prior art approaches are generally based on measuring electrical resistance characteristics upon applying an electrical direct current (DC).

SUMMARY

There may be a need for an alternative method for detecting a deterioration state in a suspension member arrangement for an elevator. Particularly, there may be a need for such method which enables fulfilling high safety requirements, simple implementation and/or low cost. More specifically, there may be a need for a method and device which enable detecting both non-uniform as well as uniform deteriorations throughout a suspension member arrangement of an elevator.

According to a first aspect of the invention, a method for detecting non-uniform and uniform deteriorations in a suspension member arrangement for an elevator is proposed. Therein, the suspension member arrangement comprises at least one suspension member having a first and a second group of electrically conductive cords. First ends of the first and second group of electrically conductive cords are electrically connected to an alternating voltage generator arrangement comprising a first voltage generator for applying a first alternating voltage $U_1$ to a first end of the first group of cords of the suspension member and a second voltage generator for applying a second alternating voltage $U_2$ to a first end of the second group of cords of the suspension member. Second ends of the first and second group of electrically conductive cords are electrically connected to each other via a neutral point at which electrical resistances to the first voltage generator and to the second voltage generator, respectively, are same in a non-deteriorated state of the suspension member arrangement. First and second electrical resistors are arranged between the neutral point and the second ends of the first and second group of electrically conductive cords, respectively. The method comprises the following steps, possibly but not necessarily in the indicated order:

applying the first alternating voltage $U_1$ to the first end of the first group of cords of the suspension member and applying the second alternating voltage $U_2$ to the first end of the second group of cords of the suspension member;

determining a neutral point voltage $U_n$ between the neutral point and an electrical reference potential;

determining a difference voltage $U_d$ between a first difference measurement point, located between the second end of the first group of electrically conductive cords and the first electrical resistor, and a second difference measurement point, located between the second end of the second group of electrically conductive cords and the second electrical resistor;

determining the deterioration state based on both the determined neutral point voltage $U_n$ and the determined difference voltage $U_d$.

According to a second aspect of the invention, a device for detecting non-uniform and uniform deterioration states in a suspension member arrangement for an elevator is proposed. Therein, the suspension member arrangement comprises at least one suspension member having a first group and a second group of electrically conductive cords. The device comprises:

an alternating voltage generator arrangement comprising a first voltage generator for applying a first alternating voltage to a first end of the first group of cords and a second voltage generator for applying a second alternating voltage to a first end of the second group of cords;

a voltage measurement arrangement comprising (i) a circuitry for electrically connecting second ends of the first and second groups of electrically conductive cords to each other via a neutral point at which electrical resistances to the first voltage generator and to the second voltage generator, respectively, are same in a non-deteriorated state of the suspension member arrangement, wherein first and second electrical resistors are arranged between the neutral point and the second ends of the first and second group of electrically conductive cords, respectively;

(ii) a neutral point voltage determining unit for determining neutral point voltages $U_n$ between the neutral point and an electrical reference potential; and (iii) a difference voltage determining unit for determining a difference voltage $U_d$ between a first difference measurement point, located between the second end of the first group of electrically conductive cords and the first electrical resistor ($R_a$), and a second difference measurement point, located between the second end of the second group of electrically conductive cords and the second electrical resistor ($R_b$).

An additional aspect of the present invention already described in the priority documents relates to a method for detecting a deterioration state in a suspension member arrangement for an elevator. Therein, the suspension member arrangement comprises at least one suspension member having a first and a second group of electrically conductive cords. The method comprises at least the following steps, preferably in the indicated order:

A first alternating voltage $U_1$ is applied to a first end of the first group of cords of the suspension member and a second alternating voltage $U_2$ is applied to a first end of the second group of cords of the suspension member. Therein the first and second alternating voltages have same waveforms and a phase difference of substantially 180°.

Then, a summed voltage ($U_3+U_4$) correlating to a sum of a third voltage ($U_3$) between the second end of the first group of cords and a common electrical potential and a fourth voltage ($U_4$) between the second end of the second group of cords and the common electrical potential and/or (ii) a differential voltage ($U_3-U_4$) correlating to a difference between the third voltage ($U_3$) and the fourth voltage ($U_4$) are determined.

Finally, the deterioration state of the suspension member arrangement is determined based on at least one of the summed voltage and the differential voltage.

A further additional aspect of the present invention already described in the priority documents relates to a device for detecting a deterioration state in a suspension member arrangement for an elevator. Therein, the suspension member arrangement comprises at least one suspension member having a first and a second group of electrically conductive cords. The device comprises at least an alternating voltage generator arrangement, at least one voltage measurement arrangement and the determination unit. The alternating voltage generator arrangement is adapted for applying a first alternating voltage $U_1$ to a first end of the first group of cords of the suspension member and for applying a second alternating voltage $U_2$ to a first end of the second group of cords of the suspension member. Therein, the alternating voltage generator arrangement is configured to generating the first and second alternating voltages with same waveforms and a phase difference of substantially 180°. Furthermore, the device comprises a first voltage measurement arrangement and/or a second measurement arrangement. Therein, the first voltage measurement arrangement is adapted for determining a summed voltage ($U_3+U_4$) correlating to a sum of a third voltage ($U_3$) between the second end of the first group of cords and a common electrical potential and a fourth voltage ($U_4$) between the second end of the second group of cords and the common electrical potential. The second voltage measurement arrangement is adapted for determining a differential voltage ($U_3-U_4$) correlating to a difference between the third voltage ($U_3$) and the fourth voltage ($U_4$). The determination unit is adapted for determining the deterioration state of the suspension member arrangement based on at least one of the summed voltage and the differential voltage.

Without restricting the scope of the invention in any way, ideas underlying embodiments of the invention may be understood as being based, inter alia, on the following recognitions and observations:

In conventional approaches for detecting a deterioration state of a load bearing capacity in a suspension member arrangement such as those approaches indicated in the above introductory portion, electrical characteristics of cords included in a suspension member have been taken as indicators for changes in the deterioration state. Generally, electrical resistances within the cords have been measured and it has been assumed that an increase of such electrical resistances indicates a deterioration of the load bearing capacity of the suspension member.

However, such electrical resistance measurements, or alternatively impedance measurements, may require substantial efforts in terms of, e.g., measuring devices, measurement analyzing devices, circuitry, etc. For example, electrical resistances have to be included, measured and compared within circuitry comprising cords of a suspension member in order to thereby enable quantitative measurements of the electrical resistance or impedance of the cords.

The inventors of the present invention have found that measuring electrical resistance/conductivity of cords, particularly measuring quantitatively such characteristics, is not necessary in order to obtain sufficient information about a deterioration state of a load bearing capacity in a suspension member to ensure safe operation of an elevator.

As an alternative approach to conventional methods and devices, it is therefore proposed to not necessarily measure any electrical resistance, resistivity or impedance within conductive cords of a suspension member directly but to provide for a method and a device which allow for deriving sufficient information about a deterioration state by measuring one or more electric voltages which at least relate to a correlation of electric voltages occurring at ends of two groups of cords of the suspension member when alternating voltages are applied to opposite ends of these two groups of cords.

In such alternative approach, electrical resistances, resistivities or impedances do neither have to be known quantitatively on an absolute scale nor in a relative manner. Instead, it may be sufficient to simply measure electric voltages, particularly sums of electrical voltages and/or differences of electrical voltages, without having any detailed knowledge about actual resistances, resistivities and/or impedances through the cords of the suspension member.

Briefly summarized and expressed in a simpler wording than in the claims, but without restricting the scope of the claims, an idea underlying the inventive method and device as already described in the priority documents may be briefly summarized as follows:

The cords comprised in a suspension member may be divided into two groups of cords. Preferably, both groups comprise the same number of cords. Further preferably, a first group may comprise all even numbered cords and a second group may comprise all odd numbered cords, such that each cord of one of the groups is arranged between two neighboring cords of the other group of cords (of course except for the two cords arranged at the outer borders of the suspension member).

Then, alternating voltages $U_1$, $U_2$ are applied to a respective first end of each of the groups of cords using an alternating voltage generator arrangement. The alternating voltages $U_1$, $U_2$ comprise an alternating voltage (AC) component in which a voltage periodically varies between a minimum value $U_{min}$ and a maximum value $U_{max}$. Furthermore, the alternating voltages $U_1$, $U_2$ may comprise a direct voltage (DC) component $U_{DC}$. The alternating voltage generator arrangement may comprise two separate alternating voltage generators $G_1$, $G_2$ which are synchronized in a specific manner with each other. Alternatively, the alternating voltage generator arrangement may comprise a single alternating voltage generator G comprising a direct output and an inverted output in order to provide the required two alternating voltages $U_1$, $U_2$. Therein, it may be important that the waveforms of both alternating voltages $U_1$, $U_2$ are substantially the same, i.e. deviate from each other by less than an acceptable tolerance, such tolerance being for example less than 5% or preferably less than 2%. Furthermore, the alternating voltage generator arrangement shall generate the two alternating voltages $U_1$, $U_2$ with a phase shift of substantially 180°, particularly with a phase shift of 180°±an acceptable tolerance of e.g. less than 5%, preferably less than 2%.

Then, at least one voltage measurement is performed using at least one voltage measurement arrangement. Specifically, a voltage named herein "summed voltage" $U_+$ and/or a voltage named herein "differential voltage" $U_-$ is determined. Both, the "summed voltage" $U_+$ and the "differential voltage" $U_-$ may be measured at least with their alternating voltage components $U_{+,AC}$, $U_{-,AC}$, but preferably with both, their alternating voltage components $U_{+,AC}$, $U_{-,AC}$ and their direct voltage component $U_{+,DC}$, $U_{-,DC}$. In the alternating voltage components $U_{+,AC}$, $U_{-,AC}$, both an amplitude and phase may be determined. As will be described further below, valuable information about the deterioration state of the suspension member may be derived particularly from the phase information included in the measurement of at least one of the alternating voltage components $U_{+,AC}$, $U_{-,AC}$.

Therein, the summed voltage $U_+$ correlates in a predetermined manner to a sum $(U_3+U_4)$ of a third voltage $(U_3)$ and a fourth voltage $(U_4)$ whereas the differential voltage $U_-$ correlates in a predetermined manner to a difference $(U_3-U_4)$ between the third voltage $(U_3)$ and the fourth voltage $(U_4)$. The third voltage $(U_3)$ occurs between the second end of the first group of cords and a common electrical potential such as e.g. a ground potential. The fourth voltage $(U_4)$ occurs between the second end of the second group of cords and the common electrical potential such as e.g. the ground potential.

The summed voltage $U_+$ and the differential voltage $U_-$ may be directly the sum $(U_3+U_4)$ and the difference $(U_3-U_4)$, respectively. Alternatively, the summed voltage $U_+$ may proportionally correlate to such sum $(U_3+U_4)$, i.e. may be a multiple of such sum such as e.g. $(U_3+U_4)/2$. Analogously, the differential voltage $U_-$ may proportionally correlate to the difference $(U_3-U_4)$, i.e. may be a multiple of such difference. As a further alternative, the voltage measurement arrangement may measure voltages $(U_1)$, $(U_2)$ occurring at opposite first ends of both groups of cords and may determine a sum $(U_1+U_2)$ and/or difference $(U_1-U_2)$ or a multiple of such sum/difference which, due to the fact that $(U_1)$, $(U_2)$ occur in the common circuitry with $(U_3)$, $(U_4)$, correlate in an unambiguous manner to the sum $(U_3+U_4)$ and to the difference $(U_3-U_4)$, respectively.

Information about the deterioration state of the suspension member may be derived from at least one of a phase determination in the alternating voltage components $U_{+,AC}$, $U_{-,AC}$, of the summed voltage $U_+$ and/or the differential voltage $U^-$, (ii) an amplitude determination in the alternating voltage components $U_{+,AC}$, $U_{-,AC}$, of the summed voltage $U_+$ and/or the differential voltage $U_-$, and (iii) a value determination in the direct voltage components $U_{+,DC}$, $U_{-,DC}$, of the summed voltage $U_+$ and/or the differential voltage $U_-$.

In a normal state in which no deteriorations occur in the cords of the suspension member, both the third and fourth voltage $U_3$, $U_4$ should directly follow the applied alternating voltages $U_1$, $U_2$, i.e. with a same phase but with a reduced amplitude, and should therefore be both same in amplitude but with a phase shift of 180° such that the summed voltage $U_+$ should be a constant direct voltage (DC) (i.e. $U_{+,AC}=0$) and the differential voltage $U_-$ should be an alternating voltage (AC) (i.e. $U_{-,AC}\neq0$) having double the amplitude than each of the third and fourth voltages $U_3$, $U_4$.

However, when any deterioration occurs in the cords of the suspension member, such as one or more local breakages of cords, significant corrosion of cords, defects in an electrically isolating cover enclosing and electrically separating neighboring cords (such defects potentially resulting in shorts between neighboring cords and/or electrical connections to ground of some cords), etc., the summed voltage $U_+$ and/or the differential voltage $U_-$ generally significantly change. Such changes may be detected and may then be interpreted as indicating specific types and/or degrees of deteriorations in the suspension member.

For example, an increase of an electrical resistance due to e.g. corrosion or even a breakage in one of the cords will significantly change a respective one of the third and fourth voltages $U_3$, $U_4$ occurring at the second end of the respective group of cords including the deteriorated cord. Accordingly, due to such voltage change, for example no purely direct voltage (DC) is measured anymore for the summed voltage $U_+$.

Other deteriorations of the suspension member and/or its cords generally result in other deviations of the summed voltage $U_+$ and/or the differential voltage $U_-$ from their initial "normal" behavior, as will be described in more detail further below.

Accordingly, upon applying phase-shifted first and second voltages of same waveforms to first ends of two groups of cords, valuable information about a current deterioration state in the suspension member of the suspension member arrangement may be derived by measuring third and fourth voltages $U_3$, $U_4$ at or between the second ends of both groups of cords (or measuring any multiple thereof or any voltages correlating thereto) and correlating them as the sum (e.g. $U_3+U_4$) and/or the difference (e.g. $U_3-U_4$).

As will be described further below, additional information about a specific type, degree and/or location of an occurring deterioration may be derived when measurements of both the summed voltage $U_+$ and the differential voltage $U_-$ are taken into account.

A possible advantage obtainable with the approach described herein is that, in contrast to most prior art approaches, no electrical direct current (DC) is applied to the cords of a belt but, instead, alternating currents (AC) are applied. Applying such alternating currents may significantly reduce a risk of any electro-corrosion at the cords.

Briefly summarized and expressed in a simpler wording than in the claims, but without restricting the scope of the claims, ideas underlying embodiments of the inventive method and device in accordance with the claims presented herein may be briefly summarized as follows:

Various different types of deteriorations in suspension members may be detected by measuring specific voltages such as the summed voltage $U_+$ and the differential voltage $U_-$ described above.

Specifically, it has been found that for detecting at least some deteriorations of major importance, it may be generally sufficient to measure only two specific voltages referred to herein as neutral point voltage $U_n$ and difference voltage $U_d$.

The neutral point voltage $U_n$ may be a differential voltage between a specific point in a circuitry including the cords of the suspension member and an electrical reference potential such as a ground potential. Therein, the specific point in the circuitry is referred to as the neutral point and the measured voltage is referred to as neutral point voltage. The neutral point occurs in a circuitry in which two alternating voltages are applied to both groups of cords, respectively, with a phase shift of preferably 180° being present between the two alternating voltages and in which both second ends of the first and second groups of cords are electrically connected to each other. Specifically, the neutral point is the location in such circuitry at which an electrical resistance between the neutral point and the first voltage generator, on the one hand, and an electrical resistance between the neutral point and the second voltage generator, on the other hand, are substantially equal (i.e. differing from each other by less than a predetermined tolerance of e.g. less than 5% or less than 2%) in a non-deteriorated state of the suspension members (i.e. for example directly after manufacturing and/or installing the suspension members).

The difference voltage $U_d$ may an absolute voltage difference or potential difference. The difference voltage $U_d$ may be measured upon a first electrical resistor $R_a$ being arranged between the neutral point and the second end of the first group of electrically conductive cords and a second electrical resistors $R_b$ being arranged between the neutral point and the second end of the second group of electrically conductive cords. In such case, the difference voltage $U_d$ may be measured between the first difference measurement point, which is located between the second end of the first group of electrically conductive cords and the first electrical resistor, on the one side, and a second difference measurement point, which is located between the second end of the second group of electrically conductive cords and the second electrical resistor, on the other side.

As long as no deterioration occurs in the suspension members, an AC component of the neutral point voltage remains "0" as long as the AC voltages $U_1$, $U_2$ applied to the first and second group of cords are in a symmetric condition, i.e. are of equal waveform and are shifted by 180°, and the voltage drops throughout both groups of cords are identical. In other words, as long as the applied voltages and the included electrical resistances at both groups of cords are equal, there is a symmetric or balanced situation in which 180° shifted voltages compensate each other at the neutral point.

As soon as specific deteriorations (referred to herein as non-uniform deteriorations) such as interruptions in cords, electrical shorts between cords or electrical connections to ground (due to e.g. damages in an isolating sheath separating cords from each other or from e.g. a traction sheave or a pulley) occur, such situation becomes asymmetric/unbalanced such that the AC component of the neutral point voltage will no more remain "0". Such non-uniformly deteriorated situations may be detected easily by continuously or repeatedly monitoring the neutral point voltage upon same AC voltages $U_1$, $U_2$ being applied to the first and second group of cords with a 180° shift.

However, it has been found that e.g. in case of a uniform or homogeneous deterioration of all cords, i.e. of cords in both the first and second group of cords, the situation within the circuitry also remains symmetric/balanced. For example, if all cords in the suspension member arrangement uniformly loose some of their load-carrying cross-section due to e.g. homogeneous corrosion, an electrical resistance through these cords will increase. While such uniform reduction in cross-section may result in a critical deterioration of the suspension member's load-bearing capacity, it may not change a symmetry/balance of voltage drops through the groups of cords. Accordingly, the AC component of the neutral point voltage remains "0" also in such cases of potentially severe but homogeneous deterioration of the suspension members' cords.

In order to enable also detection of such uniform or homogeneous deterioration of the suspension members' cords, it is proposed to perform a second voltage measurement, i.e. to additionally measure the difference voltage $U_d$.

Therein, the difference voltage $U_d$ may be or may correlate to the absolute potential difference between the voltages applying between the first and second difference measurement points. Specifically, due to the difference measurement points being separated from the neutral point by the first and second resistors, such difference voltage will indicate a voltage difference applying between the second ends of both groups of cords. While the voltages $U_1$, $U_2$ applied at the first ends of both groups of cords are generally identical with respect to the waveform and shifted with respect to each other, the voltages resulting at the opposing second ends of both groups of cords strongly depend on actual electrical characteristics within these groups of cords.

Of course, if the electrical characteristics non-uniformly change in only one of the groups of cords, then the symmetry/balance between both cords is broken and the neutral point voltage will be affected. However, if electrical characteristics uniformly change in both groups of cords, such symmetry/balance will be maintained. Accordingly, the voltages reaching the neutral point through each of the first and second group of cords will still neutralize each other due to their phase shift and the differential neutral point voltage will still comprise no AC voltage component.

However, upon such uniformly changing electrical characteristics, particularly upon uniformly increased electrical resistances throughout both groups of cords, the AC voltages occurring at the ends of both groups of cords will be affected. Specifically, their amplitude will be affected. Accordingly, by measuring the difference voltage between the corresponding difference measurement points at the second ends of the groups of cords, an indication indicating whether or not the electrical characteristics have changed uniformly/homogeneously in the groups of cords may be derived.

It may be noted that, according to the present proposal, it may be sufficient to measure only the two described voltages, i.e. the neutral point voltage $U_n$ and the difference voltage $U_d$, in order to thereby enable detecting both non-uniform deteriorations in the cords as well as uniform deteriorations in the cords.

Particularly, both voltage measurements $U_n$ and $U_d$ may be determined at the same end of the suspension member. Thereby, both voltage measurements units, i.e. the neutral point voltage determining unit and the difference voltage determining unit, may be arranged at the same end of the suspension member and may possibly be included in a common device. Accordingly, the voltage measurement arrangement may be simple. Particularly, it is sufficient to only measure resulting voltages $U_n$ and $U_d$ while no resistance measurements need to be performed.

According to an embodiment, the process of determining of the deterioration state is based on a comparison of the difference voltage $U_d$ as currently determined with a reference difference voltage value $U_{dr}$.

In other words, for determining the deterioration state of the suspension members, the neutral point voltage may be measured and analyzed in order to detect specific types of non-uniform deteriorations such as cords being shorted or connected to ground. Therein, the neutral point voltage may be analyzed in various ways. In a separate step, the difference voltage may be measured and analyzed in order to detect at least one other type of deterioration, particularly in order to detect uniform/homogeneous deterioration of the cords in the suspension member. For this purpose, the difference voltage is compared to a reference difference voltage value and based on such comparison it may be determined whether the suspension members are excessively deteriorated in a homogeneous manner.

Specifically, according to an embodiment, the reference difference voltage value $U_{dr}$ correlates to the difference voltage $U_d$ as measured in a non-deteriorated state of the suspension member arrangement.

In other words, the reference difference voltage value may be the difference voltage which is measured as long as the suspension members are not substantially deteriorated, i.e. for example in a state of the suspension members directly after production thereof. While also in such non-deteriorated state there will be a non-zero AC component of the difference voltage, such initial difference voltage will typically significantly differ from any difference voltage measured after some lifetime of the suspension members, i.e. measured upon the cords in the suspension members being for example corroded to a certain degree and therefore having deteriorated and having changed their electric resistance.

Accordingly, upon repeatedly comparing a currently measured difference voltage with e.g. an initially measured difference voltage or any reference difference voltage value directly correlating thereto, information about a current deterioration state of the suspension member including information about any uniform deteriorations may be derived.

Thus, in accordance with an embodiment, any deviation from a state in which
  as a first criterion, the neutral point voltage $U_n$ comprises no alternating voltage component $U_{n,AC}$ larger than a predetermined first tolerance, and
  as a second criterion, the difference voltage $U_d$ differs from the reference difference voltage value $U_{dr}$ by less than a predetermined second tolerance,
is interpreted as indicating an excessive deterioration in the suspension member arrangement.

In other words, if either the neutral point voltage comprises a significant non-zero AC voltage component or the difference voltage significantly differs from the predetermined reference difference voltage value, or both, it may be assumed that an excessive deterioration has occurred within the suspension members.

Therein, the first and/or second tolerances may be determined based for example upon specific experimentations and/or regulations to be fulfilled. For example, a difference voltage which differs from the reference difference voltage value by more than a tolerance of e.g. 2%, 5%, 10%, 20%, 30%, 40% or 50% or, alternatively, by more than a specified absolute voltage difference, may be interpreted as indicating an excessive deterioration in the suspension member arrangement.

Therein, the acceptable tolerances may be determined each for example using experiments in which suspension members are specifically deteriorated in a purposeful manner up to a degree at which their load bearing capacity decreases beyond an acceptable limit and determining the difference voltage under such specifically deteriorated conditions.

According to an embodiment, in the above second criterion, an amplitude of an alternating voltage component $U_{d,AC}$ of the difference voltage $U_d$ shall differ from an amplitude of the reference difference voltage value $U_{dr}$ by less than a predetermined second tolerance.

In other words, whether or not the suspension members have uniformly deteriorated may be determined based on differences of amplitudes of AC components of the difference voltage as currently measured and of the reference difference voltage value corresponding e.g. to the difference voltage as measured at an earlier point in time. For example, amplitudes of both difference voltages should preferably differ by at least 2%, 5% or 10% in order to assume any excessive uniform deteriorations. Generally, the more the currently measured difference voltage differs from the reference value with respect to their amplitudes, the more any deteriorations within the cords of the suspension members will influence the difference voltage such that such deteriorations may be detected more easily.

According to an embodiment, an electrical resistance of the sum of the first and second resistors $R_a$, $R_b$ is larger than an electrical resistance through each one of the first and second groups of cords in a non-deteriorated state of the suspension member arrangement.

In other words, the first and second resistors $R_a$, $R_b$ should have a substantial electrical resistance compared to the electrical resistances through each of the groups of cords. Particularly, each of the first and second resistors $R_a$, $R_b$ should preferably have an electrical resistance which is at least half the electrical resistance through a group of cords as long as no resistance increases occurred in the cords due to deteriorations. For example, the resistors may have electrical resistances of more than 10 Ohms, preferably in a magnitude of approximately 100 Ohms. Preferably, both resistors have same electrical resistances, particularly when both groups of cords comprise same configurations and therefore generate same electrical resistances.

Accordingly, the neutral point is separated from the first voltage generator by the intermediate first group of cords and the intermediate first resistor whereas it is separated from the second voltage generator by the intermediate second group of cords and the intermediate second resistor. Accordingly, with resistances through the groups of cords being identical and the first and second resistors having identical resistances, the differential voltage at the neutral point will be compensated upon same voltages $U_1$, $U_2$ with 180° phase shift being applied to the groups of cords. However, as the first and second difference measurement points are separated from the neutral point by the intermediate first and second resistors, an absolute voltage difference between these difference measurement points will be substantially influenced by the actual electrical resistances throughout the groups of cords.

Accordingly, while only a voltage, i.e. the difference voltage $U_d$, is measured but no resistance or current is measured, the measured difference voltage $U_d$ comprises information about actual resistances throughout the cords, thereby providing information about any uniform deteriorations throughout the cords.

It shall be noted that the applicant of the present application has filed a US provisional application U.S. 62/199,375 and a US non-provisional application U.S. Ser. No. 14/814,558 which relate to a more generalized approach for determining deteriorations in a suspension member arrangement for an elevator. Many features described therein may be applied directly or in a modified manner to embodiments of the present invention. Accordingly, the content of this application shall be incorporated herein by reference.

It shall be noted that possible features and advantages of embodiments of the invention are described herein partly with respect to a method for detecting a deterioration state in a suspension member arrangement and partly with respect to a device which is adapted for performing or controlling such method in an elevator. One skilled in the art will recognize that the features may be suitably transferred from one embodiment to another, i.e. from the method to the device or vice versa, and features may be modified, adapted, combined and/or replaced, etc. in order to come to further embodiments of the invention.

In the following, advantageous embodiments of the invention will be described with reference to the enclosed drawings. However, neither the drawings nor the description shall be interpreted as limiting the invention.

The figures are only schematic representations and are not to scale. Same reference signs refer to same or similar features throughout the figures.

DETAILED DESCRIPTION

Background

Figure 1:
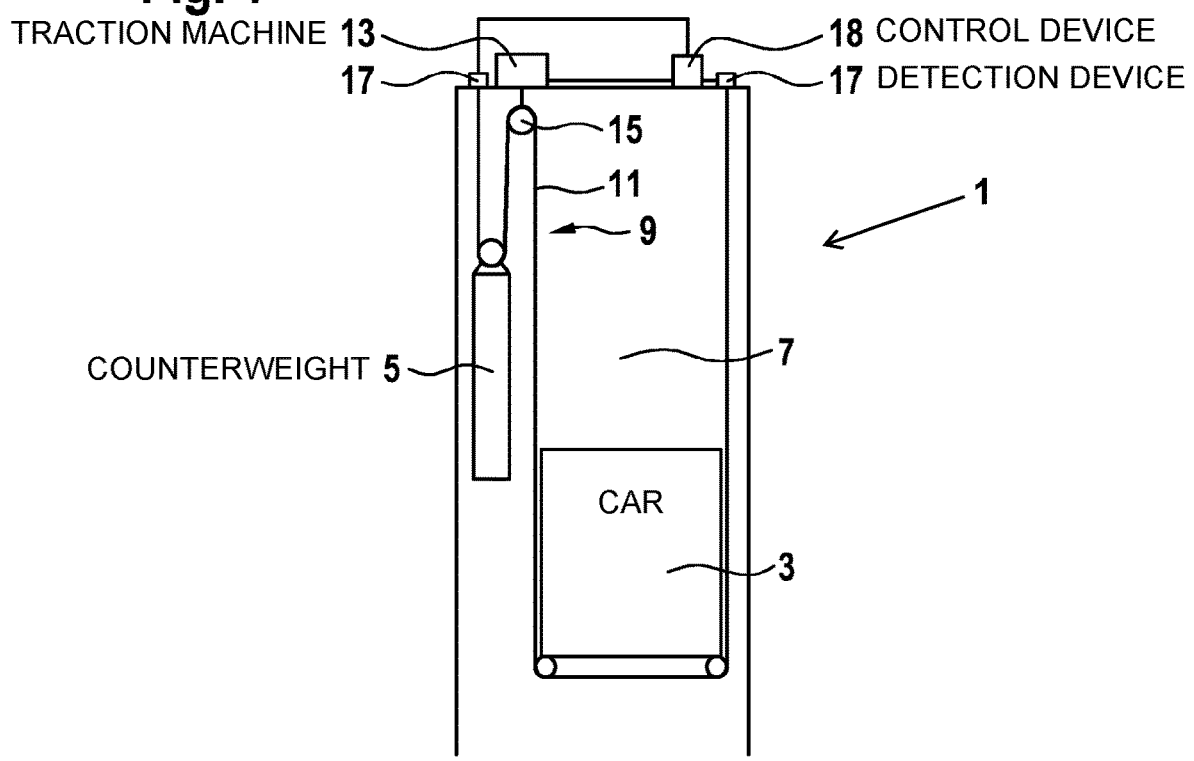
FIG. 1 shows an elevator in which a method according to an embodiment of the invention may be applied.

FIG. 1 shows an elevator 1 in which a method according to embodiments of the present invention may be implemented.

The elevator 1 comprises a car 3 and a counterweight 5 which may be displaced vertically within an elevator shaft 7. The car 3 and the counterweight 5 are suspended by a suspension member arrangement 9. This suspension member arrangement 9 comprises one or more suspension members 11, sometimes also referred to a suspension traction media (STM). Such suspension members 11 may be for example ropes, belts, etc. In the arrangement shown in FIG. 1, end portions of the suspension members 11 are fixed to a supporting structure of the elevator 1 at a top of the elevator shaft 7. The suspension members 11 may be displaced using an elevator traction machine 13 driving a traction sheave 15. An operation of the elevator traction machine 13 may be controlled by a control device 18. For example at opposite end portions of the suspension member arrangement 9 components of a device 17 for detecting a deterioration state in the suspension member arrangement 9 may be provided.

It may be noted that the elevator 1 and particularly its suspension member(s) 11 and its device 17 for detecting deterioration may be configured and arranged in various other ways than those shown in FIG. 1.

The suspension members 11 to be driven for example by the traction machine 13 may utilize metal cords or ropes to support a suspended load such as the car 3 and/or the counterweight 5 that is moved by the traction machine 13.

Figure 2:
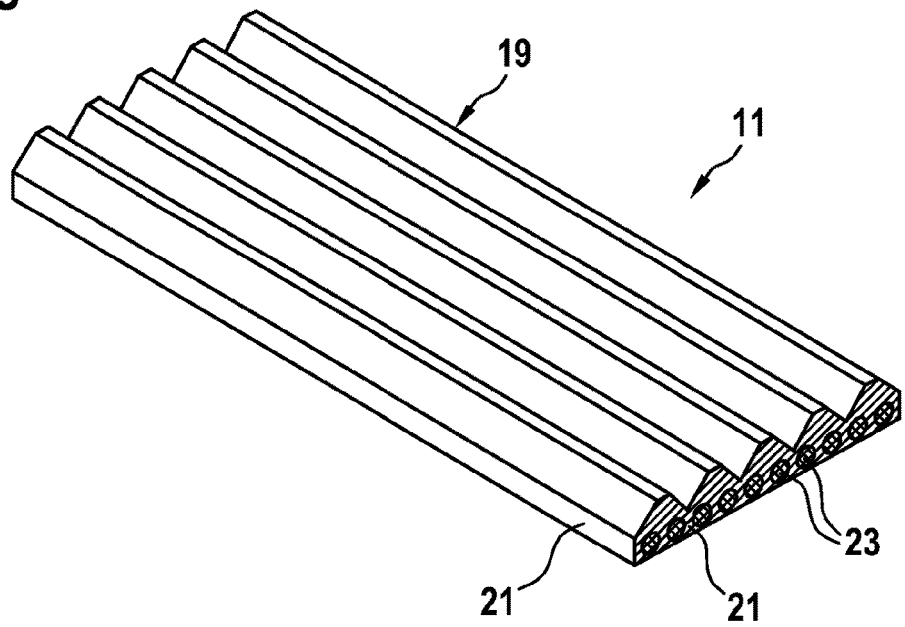
FIG. 2 shows a suspension member.

FIG. 2 shows an example of a suspension member 11 which is embodied with a belt 19. The belt 19 comprises a plurality of cords 23 which are arranged parallel to and spaced from each other. The cords 23 are enclosed in a matrix material 21 forming, inter alia, a coating. Such coating may mechanically couple neighboring cords 23. The coating may have a textured or profiled surface including longitudinal guiding grooves. The cords 23 may typically consist of or comprise wires made from a metal such as steel. The matrix material 21 may consist of or comprises a plastic or elastomeric material. Accordingly, the cords 23 are typically electrically conductive such that an electric voltage may be applied to and/or an electric current may be fed through the cords without significant losses. Furthermore, the cords 23 are preferably electrically isolated from each other via the interposed electrically insulating matrix material 21 such that, as long as an integrity of the coating is not deteriorated, an electrical current or voltage between neighboring cords cannot be transmitted, i.e. no significant shunt current can flow from one cord 23 to another.

Alternatively, suspension members 11 may have other shapes or configurations. For example, a belt may have several cords included into a body formed of matrix material, the body being non-profiled (i.e. flat) or having other shapes as those shown in FIG. 2. Alternatively, each cord may be enclosed by matrix material forming a kind of coating wherein the coated cords are separate from each other, i.e. not connected to each other via common matrix material. Generally, the suspension members 11 may be provided as coated steel suspension members.

Typically, wires or cords of the suspension member 11 have a specified minimum strength to ensure an integrity of the suspension member arrangement 9 during its use in an application within an elevator 1. In certain suspension applications, such as for lifts or elevators, a factor-of-safety requirement for strength combined with other measures, such as protective coating of the cords 23 for example within the matrix material 21, may sustain an initial strength of a suspension member beyond an effective life of the protective measures employed to retain strength.

Particularly in such cases, where the initial strength of the suspension member 11 is not expected to change during its useful life in an application, a simple electronic method may be employed and may be sufficient to detect an indication that for example initial physical properties of the suspension members have unexpectedly changed and trigger for example a replacement of the suspension member 11 or other counter-measures.

Prior Art Approaches

In prior art, methods have been employed to ensure that suspension members do not fall below a specified minimum strength, such methods involving for example visually counting of broken wires of cords or wire rope strands over a length of the suspension members. Alternatively, complex electronic methods that measure small changes in an electrical resistance of for example metal cords and compare such measurements with reference values or a rate of change in resistance have been proposed.

Although such methods may be effective, they may have certain disadvantages. For example, counting broken wires may be a tedious task to be periodically performed by persons maintaining the suspension members of an elevator and may be flawed by human error. In cases where suspension members have an opaque coating on the metal cords or the metal cords are incorporated into a matrix material, it is generally not possible to visually count broken wires. Where methods employ monitoring a change in electrical resistance or impedance of metal cords, the measurements are generally made across electrical connections to the steel cords and may introduce, by nature of such electrical connections, a significant source of possible errors due to for example very low values of electrical resistances being monitored. Furthermore, over time, such electrical connections may deteriorate due to effects of e.g. oxidation and/or contamination and may increase a potential for errors by the monitoring method. Additionally, such methods typically involve complex circuits necessary for measuring the very small changes in resistance or impedance and comparing them for example to target reference resistance values that may drift over time or due to effects of temperature. Furthermore, some prior art approaches may require extensive correlation to map a change in resistance or impedance of the steel cords with changes in a strength and/or physical deterioration of the steel cord.

New Approach

Accordingly, there may be a need for a less complex and/or more effective monitoring method for detecting a deterioration in suspension members in an elevator, particularly, in case these suspension members are expected to retain their initial strength over the life of their application.

As described herein, a simple and reliable method may be achieved using a two-phase current monitoring of e.g. steel cords in a suspension member, particularly where only a significant change in initial physical conditions of the cords need to be monitored.

Details of embodiments of the invention described in the priority documents will now be described with reference to FIGS. 3 to 14. It shall be noted that features and details of these embodiments may be applied or adapted to embodiments of the present invention.

Figure 3:
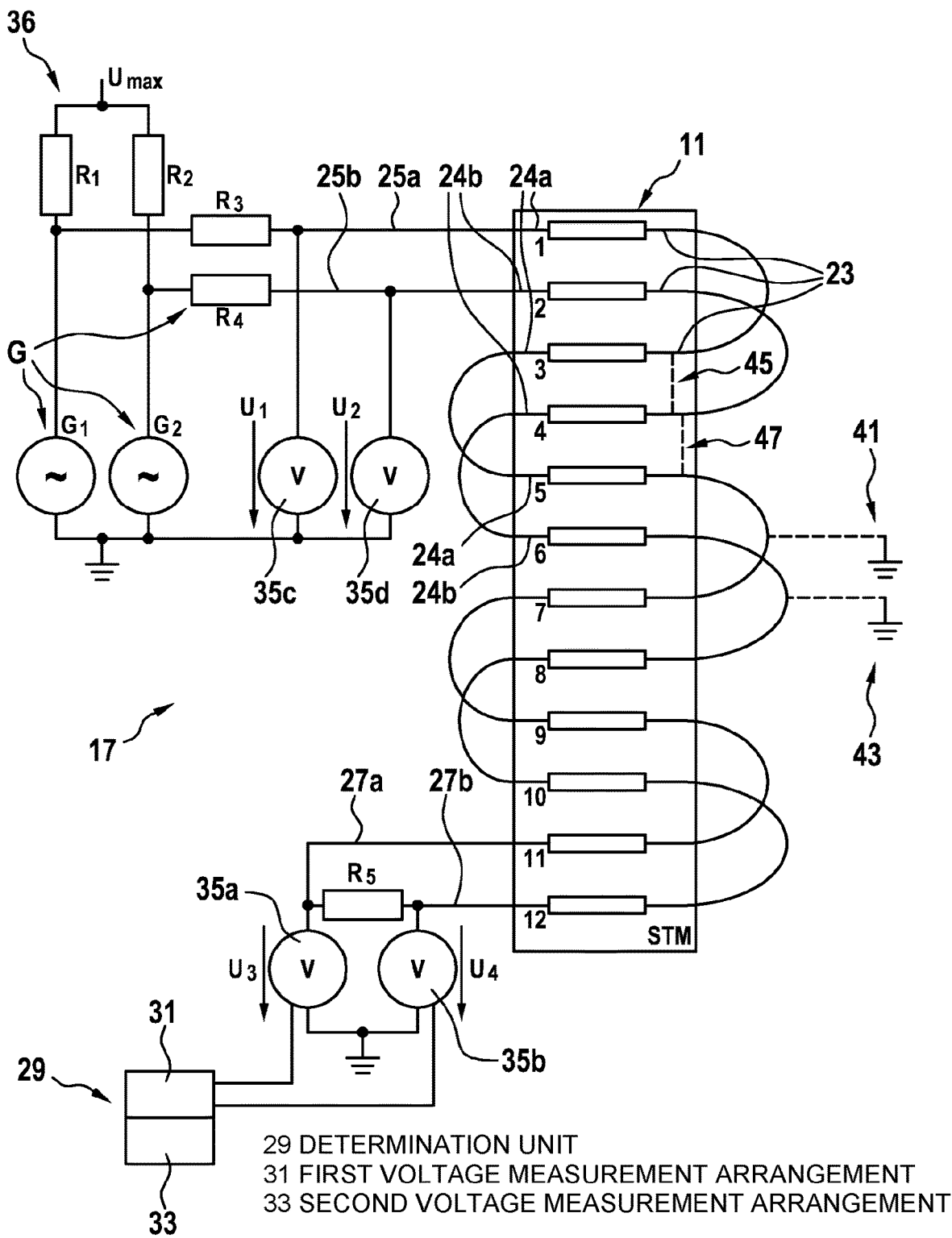
FIG. 3 shows a measurement arrangement to be applied in the method for detecting the deterioration state in the suspension member arrangement according to an embodiment of the invention disclosed in the priority documents.

FIG. 3 shows an exemplary embodiment of a device 17 for detecting a deterioration state in a suspension member arrangement 9 for an elevator 1. Therein, the suspension member arrangement 9 may comprise one or more suspension members 11 such as for example belts as shown in FIG. 2 including a plurality of electrically conducting cords 23. In FIG. 3, the cords 23 are only indicated schematically as twelve elongate cords 23 being arranged parallel to each other.

The multiplicity of cords 23 may be divided into two groups 24a, 24b of cords. For example, a first group 24a of cords may comprise all odd numbered cords 23 whereas a second group 24b of cords may comprise all even numbered cords 23.

The device 17 comprises an alternating voltage generator arrangement G which is adapted for applying a first alternating voltage $U_1$ to a first end 25a of the first group 24a of cords 23 and for applying a second alternating voltage $U_2$ to a first end 25b of the second group 24b of cords 23.

In the embodiment shown in FIG. 3, the alternating voltage generator arrangement G comprises a first alternating voltage generator $G_1$ and a second alternating voltage generator $G_2$. The two alternating voltage generators $G_1$, $G_2$ may be separate devices and may operate in principle independently from each other. However, the two alternating voltage generators $G_1$, $G_2$ should be synchronized such as to operate with a stationary phase relationship with respect to each other.

The alternating voltage generators $G_1$, $G_2$ are electrically connected, on their one side, to an electrical ground potential, whereas, on their other side, they are electrically connected to the first ends 25a, 25b of the first and second groups 24a, 24b of cords 23, respectively. The alternating voltage generators $G_1$, $G_2$ generate first and second generated voltages $U_{G1}$, $U_{G2}$, respectively.

An internal electrical resistance of each of the alternating voltage generators $G_1$, $G_2$ is represented in FIG. 3 by $R_3$, $R_4$. Due to such internal resistances $R_3$, $R_4$, the actual first and second voltages $U_1$, $U_2$ applied to the cords 23 may generally be lower than the generated voltages $U_{G1}$, $U_{G2}$ generated by the alternating voltage generators $G_1$, $G_2$ themselves.

The alternating voltage generator arrangement G with its alternating voltage generators $G_1$, $G_2$ is configured to generating the first and second alternating voltages $U_1$, $U_2$ with same waveforms and with a fixed phase difference of essentially 180°. Therein, the waveforms should differ from each other at most by an acceptable tolerance of for example less than 5% and the phase difference should differ from 180° at most by an acceptable tolerance of for example less than 10°, preferably less than 5° or less than 2°.

In examples and embodiments described herein below, it will be assumed that the alternating voltage generator arrangement G has a specific exemplary implementation in which it generates first and second generated voltages $U_{G1}$, $U_{G2}$ having an amplitude of 6 V and oscillating around a DC voltage of 6 V. In other words, the first and second generated voltages $U_{G1}$, $U_{G2}$ oscillate between $U_{min}$=0 V and $U_{max}$=12 V. Therein, the waveform is sinusoidal. An oscillation frequency is selected to be 280 Hz. The internal resistances $R_3$, $R_4$ are selected to be 450 Ohm.

However, it shall be noted that the alternating voltage generator arrangement G may be implemented in various other manners. For example, the first and second generated voltages $U_{G1}$, $U_{G2}$ may be generated with other waveforms such as rectangular waveforms or triangular waveforms. Furthermore, the amplitude and/or frequency of the first and second alternating generated voltages $U_{G1}$, $U_{G2}$ may be selected in various other manners. For example, the generated voltages $U_{G1}$, $U_{G2}$ may oscillate between other minimum and maximum voltages $U_{min}$, $U_{max}$. Specifically, the alternating voltages do not necessarily have to oscillate around a fixed non-zero DC voltage but may also oscillate around 0 V, i.e. oscillate between a negative voltage −Umax and a positive voltage +Umax. Such implementation may be advantageous with respect to electro-corrosion characteristics.

Furthermore, the internal resistances $R_3$, $R_4$ may be selected in various manners and may be specifically adapted to a specific application, for example depending on electrical resistances generated by the cords 23 to which the first and second alternating voltages $U_1$, $U_2$ shall be applied.

Furthermore, instead of providing the alternating voltage generator arrangement G with two separate alternating voltage generators $G_1$, $G_2$, a single alternating voltage generator may be provided and this single alternating voltage generator may provide for a direct output and an inverse output such that alternating generated voltages $U_{G1}$, $U_{G2}$ may be output with a phase-shift of 180°. For example, such single alternating voltage generator may be coupled to a transformer including for example a primary and a secondary coil wherein an inverse output voltage may be generated at a contact in a middle of the secondary coil, such inverse voltage output being shifted by 180° to a direct voltage output generated at outer contacts of the secondary coil. In such embodiment, the first and second alternating voltages $U_1$, $U_2$ are automatically synchronized with a stationary phase-shift of 180° such that, for example, no specific synchronization of two separate alternating voltage generators $G_1$, $G_2$ is required.

The first alternating voltage $U_1$ is applied to the first end 25a of the first group 24a of cords 23 of a suspension member 11 whereas the second alternating voltage $U_2$ is applied to a first end 25b of the second group 24b of cords 23 of the same suspension member 11. Within one group of cords 24a, 24b, all cords 23 comprised in this group 24a, 24b may be electrically connected to each other.

Preferably, the cords 23 of one group 24a, 24b are connected in series. In such series connection, for example all odd numbered cords 1, 3, 5, etc. are electrically connected in series to each other such as to form a kind of long single electrical conductor. Similarly, all even numbered cords 2, 4, 6, etc. may be connected in series. In such implementation, the first alternating voltage $U_1$ may be applied for example to a first end 25a of the first group 24a of cords 23 being formed by a free end of a cord 23 number 1, an opposite end of this cord number 1 being electrically connected in series to an end of a cord number 3, an opposite end of this cord number 3 again being electrically connected to a free end of a cord number 5 and so on. Accordingly, a second end 27a of this first group 24a of cords 23 is formed by a free end of a last odd numbered cord 23. Similarly, all even numbered cords 23 may be connected in series such as to electrically connect a first end 25b of this second group 24b of cords 23 to an opposite second end 27b via a single long conductor formed by the series of even numbered cords 23. In such series connection arrangement, both alternating voltages $U_1$, $U_2$ applied to first ends 25a, 25b of both groups 24a, 24b of cords 23 are transferred throughout the entire series connections formed in both groups 24a, 24b by the respective cords 23 comprised therein. Accordingly, when no electric current flows, the first and second alternating voltages $U_1$, $U_2$ also apply to the second ends 27a, 27b of both groups of cords 24a, 24b. However, in case any electric current is flowing through the cords 23 as a result of the applied alternating first and second voltages $U_1$, $U_2$, such current has to be transferred through the respective group 24a, 24b of cords 23 and thus experiences electrical resistances created by the respective cords 23. As a result, voltage drops occur throughout the respective cords 23. Accordingly, by measuring third and fourth voltages $U_3$, $U_4$ at opposite second ends 27a, 27b of each group 24a, 24b of cords 23, information about a condition within the groups 24a, 24b of cords 23 may be derived as it may be for example determined whether any electric current flows through the cords 23 in each of the groups 24a, 24b and, if this is the case, how such current "behaves".

In order to connect the alternating voltage generator arrangement G to the suspension member and suitably interconnecting all cords 23 in advantageous series connections, a connector arrangement (not shown in FIG. 3 for clarity of visualization) for establishing a series connection of all even numbered cords in the suspension member and a series connection of all odd numbered cords in the suspension member and for establishing an electrical connection for applying the first and second alternating voltages ($U_1$, $U_2$) to first ends of the series connection of even numbered cords and the series connection of odd numbered cords, respectively, may be provided.

As a side note only, it shall be noticed that the first and second groups 24a, 24b of cords 23 may be arranged and electrically connected in various other ways. For example, while it may be advantageous to include all even numbered cords and all odd numbered cords in one of the groups 24a, 24b of cords 23, respectively, it may also be possible to include each of the cords 23 of one or more suspension members 11 in other configurations to the two groups 24a, 24b of cords 23. For example, all cords 1 to n may be comprised in the first group 24a, whereas all cords n+1 to x may be comprised in the second group of cords 24b. Preferably, both groups 24a, 24b of cords 23 comprise a same number of cords 23. Furthermore, while it may be beneficial to connect all cords 23 of one group 24a, 24b in series to each other, also parallel electrical connections of all or some of the cords 23 comprised in one of the groups 24a, 24b may be possible.

At the second ends 27a, 27b of both groups 24a, 24b of cords 23, a first voltage measurement arrangement 31 and/or a second voltage measurement arrangement 33 may be provided as forming part of a determination unit 29. These components 29, 31, 33 are shown in FIG. 3 only in a schematic manner.

The first voltage measurement arrangement 31 may be adapted for determining a summed voltage $U_+$ which correlates to a sum of a third voltage $U_3$ and a fourth voltage $U_4$. Therein, the third voltage $U_3$ applies between the second end 27a of the first group 24a of cords 23 and a common electrical potential such as a ground potential. The fourth voltage $U_4$ applies between a second end 27b of the second group 24b of cords 23 and the common electrical potential.

The second voltage measurement arrangement 33 is adapted for determining a differential voltage $U_-$ correlating to a difference between the third voltage $U_3$ and the fourth voltage $U_4$.

Therein, both the summed voltage $U_+$ and the differential voltage $U_-$ shall "correlate" to the sum and difference, respectively, of $U_3$ and $U_4$ in an unambiguous manner. For example, the summed voltage $U_+$ may be equal to the sum $U_3+U_4$ and the differential voltage $U_-$ may be equal to the difference $U_3-U_4$. Alternatively, the summed voltage $U_+$ and/or the differential voltage $U_-$ may correlate to such sum $U_3+U_4$, $U_3-U_4$, respectively, in other manners such as being for example a multiple thereof. For example, $U_+$ may be equal to $x*(U_3+U_4)$ and/or $U_-$ may be equal to $y*(U_3-U_4)$, x and y being possibly any rationale number, for example x=y=1/2 or x=y=2, etc.

In principle, it may be sufficient to provide the device 17 with only one of the first and second voltage measurement arrangements 31, 33 as already from such single voltage measurement arrangement determining only the summed voltage $U_+$ or the differential voltage $U_-$, some useful information about a current deterioration state of the suspension member 11 may be derived. However, in order to obtain more useful information about the deterioration state, it may be beneficial to provide the device 17 with both the first voltage measurement arrangement 31 and the second voltage measurement arrangement 33 in order to enable for example distinguishing between various types or degrees of deterioration within the suspension member 11.

In the embodiment shown in FIG. 3, the device 17 is provided with both the first and second voltage measurement arrangements 31, 33. Therein, the two voltage measurement arrangements 31, 33 are implemented by including a first and a second voltage determining unit 35a, 35b. These voltage determining units 35a, 35b and/or other voltage determining units comprised in voltage measurement arrangements of the device 17 may be e.g. electronic devices which are adapted for electronically and preferably automatically measure electric voltages within a circuitry. Therein, the first voltage determining unit 35a is connected on its one side to the second end 27a of the first group 24a of cords 23 whereas the second voltage determining unit 35b is connected with one side to the second end 27b of the second group 24b of cords 23. An opposite side of both voltage determining units 35a, 35b is connected to an electric ground potential. Accordingly, the first and second voltage determining units 35a, 35b are adapted for measuring the third voltage $U_3$ and the fourth voltage $U_4$, respectively. Both voltage determining units 35a, 35b are then connected to the determination unit 29 in which the first voltage measurement arrangement 31 is adapted for determining the summed voltage $U_+$ and the second voltage measurement arrangement 33 is adapted for determining the differential voltage $U_-$.

Additionally to the components of the circuitry explained herein before to be used during actually measuring the summed voltage and the differential voltage, the device 17 shown in FIG. 3 comprises a pull-up voltage source 36. This pull-up voltage source 36 may apply a constant DC voltage to both first ends 25a, 25b of both groups 24a, 24b of cords 23 during an idle mode in which the alternating voltage generator arrangement G is deactivated or couple-off. Such idle mode will be described further below. The constant DC voltage may be substantially equal to the maximum voltage $U_{max}$ of the alternating generated voltages $U_{G1}$, $U_{G2}$ generated by the alternating voltage generator arrangement G. The pull-up voltage source 36 comprises internal electrical resistances $R_1$, $R_2$.

Furthermore, the device 17 may comprise a third and a fourth voltage determining unit 35c, 35d for measuring the first and second voltages $U_1$, $U_2$, respectively. Depending on the current flowing through the entire circuitry of the device 17, voltage drops at the internal resistances $R_3$, $R_4$ of the alternating voltage generator arrangement G may differ such that the first and second voltages $U_1$, $U_2$ may differ accordingly. Thus, by measuring the first and second voltages $U_1$, $U_2$ with third and a fourth voltage determining unit 35c, 35d, information about the electrical current flowing through the circuitry may be derived. This information then includes information about the deterioration state of the suspension member 11 as the electrical current flowing through the circuitry strongly depends on electrical resistances occurring within the cords 23 of the suspension member 11.

Next, a function principle of the device 17 and a method for detecting a deterioration state in a suspension member arrangement 9 performed thereby shall be described in an exemplary manner for a state where the suspension member 11 is non-deteriorated, i.e. neither the cords 23 nor the cover 21 is deteriorated or even damaged in any manner and therefore all cords 23 have same physical and electrical characteristics. Voltages, which are generated or which are measured during such method will be described with reference to FIG. 4.

In the method for monitoring the deterioration state, the alternating voltage generator arrangement G generates two alternating voltages $U_{G1}$, $U_{G2}$ which alternate in a sinusoidal manner with a frequency of 280 Hz and an amplitude of 6 V around a base direct voltage of 6 V. Such generated voltages $U_{G1}$, $U_{G2}$ result in first and second alternating voltages $U_1$, $U_2$ (not shown in FIG. 4 for clarity reasons) which are applied to first ends 25a, 25b of the first group 24a and the second group 24b of cords 23 of the suspension member 11, respectively. Of course, depending on whether or not an electric current is flowing through the circuitry, the first and second alternating voltages $U_1$, $U_2$ may be slightly lower than the generated voltages $U_{G1}$, $U_{G2}$ due to a voltage drop in the electrical resistances $R_3$, $R_4$.

The first and second voltages $U_1$, $U_2$ are then transmitted through the series connection of odd numbered cords 23 of the first group 24a and the series connection of even numbered cords 23 of the second group 24b, respectively, such that a third and a fourth alternating voltage $U_3$, $U_4$ occur at the opposite second ends 27a, 27b of both groups of cords 24a, 24b.

When there are no shunts and no electrical connection between these two second ends 27a, 27b, no electrical current will flow such that the third and fourth alternating voltages $U_3$, $U_4$ will be the same as the applied first and second alternating voltages $U_1$, $U_2$. In other words, as long as no deterioration occurs in the suspension member 11, the third and fourth alternating voltages $U_3$, $U_4$ will exactly follow the applied first and second alternating voltages $U_1$, $U_2$. Accordingly, upon determining such alternating voltage behaviors for the third and fourth alternating voltages $U_3$, $U_4$, it may be determined that the suspension member 11 is in a normal condition in which no further action is required.

In such non-deteriorated state, due to the 180° phase-shift between the third and fourth alternating voltages $U_3$, $U_4$, a summed voltage $U_+$ corresponding to the sum of the third and fourth alternating voltages $U_3$, $U_4$ is a constant voltage, i.e. a DC voltage being the sum of the base DC voltages of the generated alternating voltages $U_{G2}$ (i.e. in the given example: $U_3+U_4$=6 V+6 V=12 V). Accordingly, in such state, the summed voltage $U_+$ has no alternating voltage component (i.e. $U_{+,AC}$=0). A differential voltage $U_-$ corresponding to a difference of the third and fourth alternating voltages $U_3$, $U_4$ alternates with a same frequency as the generated voltages $U_{G1}$, $U_{G2}$ and with double the amplitude of these generated voltages $U_{G1}$, $U_{G2}$ around a DC voltage of 0 V (i.e. in the given example, $U_-$ alternates between −12 and +12 V).

As will be described in further detail below, in cases where the suspension member 11 is deteriorated or even damaged, such initial conditions for the third and fourth voltage $U_3$, $U_4$ do no longer apply. Particularly, when at least one of the cords 23 in the suspension member 11 is broken or if there is a short-circuit between cords 23 or if there is an electrical connection to ground for at least one of the cords 23, either an electrical connection between the first ends 25a, 25b and the second ends 27a, 27b is partly interrupted (i.e. in the case of a broken cord) or electrical currents will flow (i.e. in the case of short-circuits or connections to ground). Accordingly, in such deteriorated conditions, the third and fourth voltages $U_3$, $U_4$ will no longer follow the generated voltages $U_{G1}$, $U_{G2}$ in the same manner as in the non-deteriorated state and, as a result, the summed voltage $U_+$ and/or the differential voltage $U_-$ will change their behavior.

Accordingly, any deviation from a state in which the summed voltage $U_+$ comprises no alternating voltage component $U_{+,AC}$ and the differential voltage $U_-$ comprises an alternating voltage being non-zero may be interpreted as indicating a deterioration or even a damage in the monitored suspension member 11.

While, in principle, a simple circuitry of the device 17 in which the second ends 27a, 27b of the first and second groups 24a, 24b of cords 23 are not electrically connected might be sufficient for monitoring the suspension member 11 as it may at least detect whether or not the suspension member 11 is deteriorated or not, it may be advantageous to modify such open circuitry by connecting the second ends 27a, 27b of the two groups 24a, 24b of cords 23 via a connecting electrical resistance $R_5$. Such connecting electrical resistance $R_5$ may have a resistance in a range of several tens or hundreds of Ohms, i.e. a resistance which is significantly higher than resistances typically occurring throughout the series connections of cords 23 in the suspension member 11 (such resistances being typically in a range of some Ohms to a few tenth of Ohms, depending on the length of the suspension member). In the example given in FIG. 3, $R_5$ is assumed to be 100 Ohm.

Due to such electrical connection of the second ends 27a, 27b and the third and fourth voltages $U_3$, $U_4$ occurring at these second ends 27a, 27b, an electrical current may flow through the entire circuitry of the device 17. As a result of such electrical current, voltage drops will occur at all resistances included in such circuitry, thereby directly influencing all voltages $U_x$ (x=1, 2, 3, 4) at the various positions within the circuitry. For example, the first and second voltages $U_1$, $U_2$ will be lower than the generated voltages $U_{G1}$, $U_{G2}$ due to the internal resistances $R_3$, $R_4$. The third and fourth voltages $U_3$, $U_4$ at the second ends 27a, 27b will be lower than the first and second voltages $U_1$, $U_2$ due to electrical resistances within the series connections of cords 23 of the suspension member 11.

Figure 4:
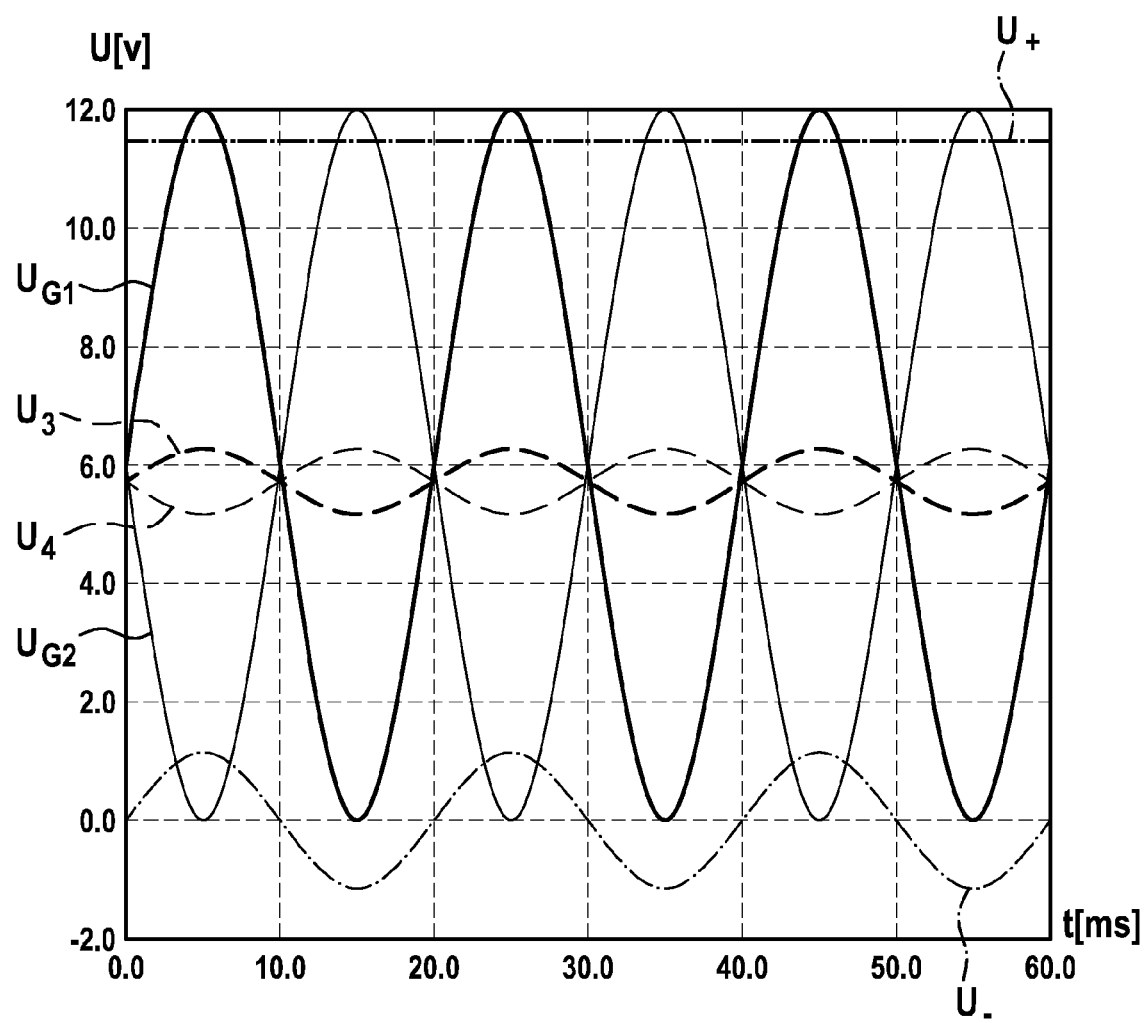
FIG. 4 shows time-dependent first and second voltages $U_1$, $U_2$ generated and applied at the first end of a suspension member and a resulting third and fourth voltages $U_3$, $U_4$ at a second end of the suspension member in a case where no significant deterioration is present at the suspension member.

Such condition is shown in the diagram of FIG. 4. Therein, the third and fourth voltages $U_3$, $U_4$ still follow the generated voltages $U_{G1}$, $U_{G2}$, i.e. are alternating voltages with a same frequency. However, both their amplitude and their DC voltage components are reduced due to the voltage drops occurring in the circuitry. However, also under these conditions, the summed voltage $U_+$ being the sum of the third and fourth voltages $U_3$, $U_4$ is a constant DC voltage, i.e. its alternating voltage component $U_{+,AC}$ is zero. The differential voltage $U_-$ being the difference between the third and the fourth voltages $U_3$, $U_4$ is again an alternating voltage having the same or inverse phase and the same frequency as the generated voltages $U_{G1}$ and $U_{G2}$, respectively.

Accordingly, also with such closed circuitry with the second ends 27a, 27b of both groups of cords 24a, 24b being connected via the connecting electrical resistance $R_5$, a state in which the summed voltage $U_+$ comprises no alternating voltage component and the differential voltage $U_-$ comprises an alternating voltage component being non-zero may be interpreted as indicating that the suspension member 11 is in a good condition whereas any deviation from such state may be interpreted as indicating a deterioration or even damage in the suspension member 11.

Next, two alternative embodiments or implementations of devices 17 for detecting the deterioration state in a suspension member arrangement 9 will be described with reference to FIGS. 5 and 6. Therein, the devices 17 follow a same operation principle as the device 17 shown in FIG. 3 but are implemented with a slightly differing circuitry. For simplification of visualization, in both FIGS. 5, 6, the series connection of cords 23 of the first and second groups 24a, 24b of cords 23 is only represented as a simple line.

Figure 5:
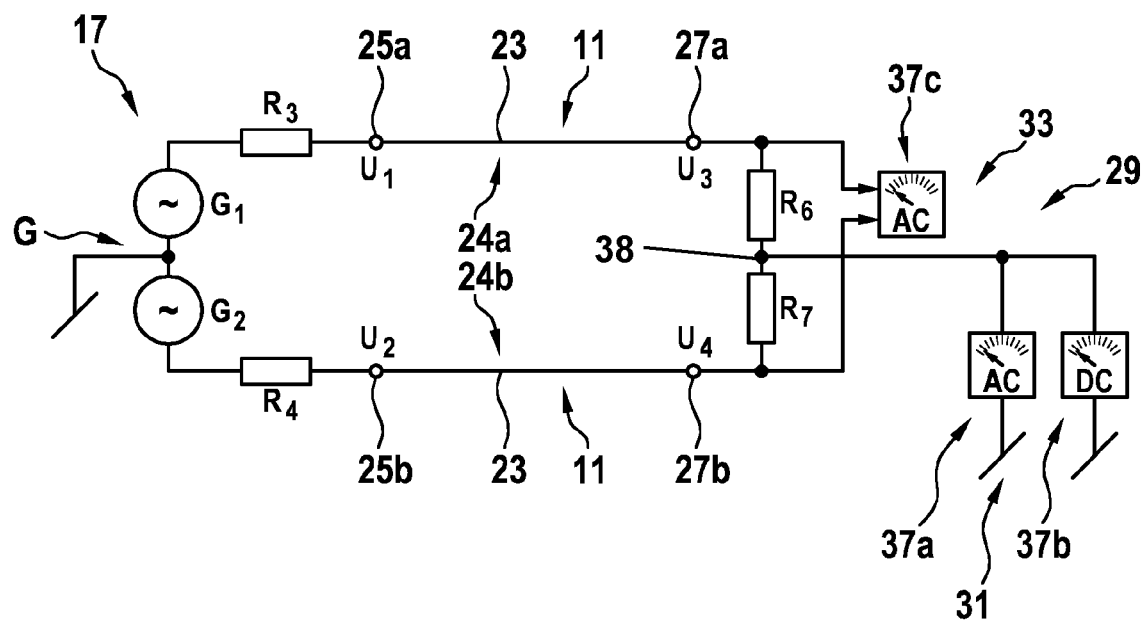
FIG. 5 shows a measurement arrangement to be applied in the method for detecting the deterioration state in the suspension member arrangement according to an alternative embodiment of the invention disclosed in the priority documents.

In the embodiment shown in FIG. 5, the alternating voltage generator arrangement G is similar to the one shown for the embodiment of FIG. 3 and applies first and second alternating voltages $U_1$, $U_2$ to first ends 25a, 25b of first and second groups 24a, 24b of cords 23 of the suspension member 11. At opposite second ends 27a, 27b, third and fourth voltages $U_3$, $U_4$ apply. However, the determination unit 29 for determining the summed voltage $U_+$ and the differential voltage $U_-$ is implemented in a different manner than in the embodiment of FIG. 3.

Specifically, the second ends 27a, 27b are electrically connected to each other via two separate connecting electrical resistances $R_6$, $R_7$. A first voltage measurement arrangement 31 comprises a first AC voltage determining unit 37a and a first DC voltage determining unit 37b. Both first voltage determining units 37a, 37b are connected to a center point 38 between the separate connecting electrical resistances $R_6$, $R_7$, on the one side, and a ground potential, on the other side. Accordingly, these first voltage determining units 37a, 37b may measure an alternating voltage component $U_{+,AC}$ and a direct voltage component $U_{+,DC}$ of a summed voltage $U_+$ being proportional to the sum of the third and fourth voltages $U_3$, $U_4$. Specifically, assuming that $R_6 = R_7$, the summed voltage $U_+$ is in this case $U_+ = (U_3 + U_4)/2$. A second voltage measurement arrangement 33 comprises a second voltage determining unit 37c which is directly connected to each of the second ends 27a, 27b. Accordingly, this second voltage determining unit 37c measures a voltage difference between the second ends 27a, 27b. In other words, the second voltage determining unit 37c measures a differential voltage $U_-$ corresponding to $U_3 - U_4$. Specifically, it may be sufficient that this second voltage determining unit 37c only measures an alternating voltage component $U_{-,AC}$ of such differential voltage $U_-$.

Figure 6:
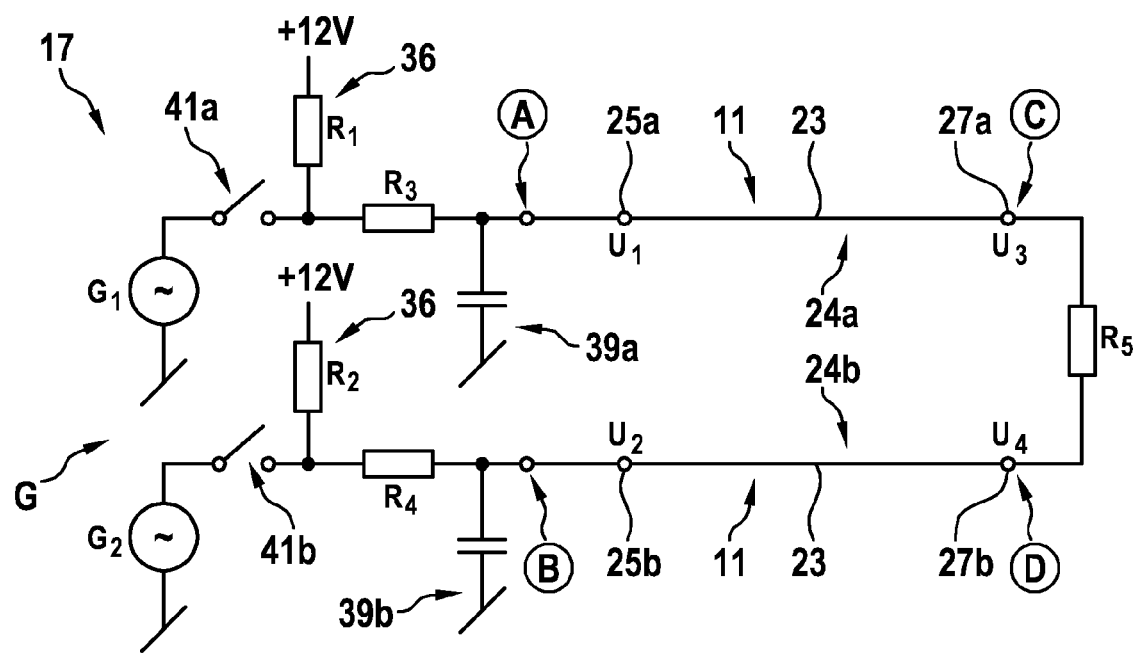
FIG. 6 shows a measurement arrangement to be applied in the method for detecting the deterioration state in the suspension member arrangement according to a further alternative embodiment of the invention disclosed in the priority documents.

FIG. 6 shows an embodiment of the device 17 which largely corresponds to the embodiment shown in FIG. 3. For simplification of visualization, letters "A" to "D" shall represent voltage measurement arrangements for measuring the first to fourth alternating voltages $U_1$, $U_2$, $U_3$, $U_4$ at respective locations at first ends 25a, 25b and second ends 27a, 27b of the groups 24a, 24b of cords 23 comprised in the suspension member 11. Furthermore, the first ends 25a, 25b are capacitively connected to a ground potential via capacitors 39a, 39b. Furthermore, the circuitry of the device 17 comprises switches 41a, 41b via which the alternating voltage generators $G_1$, $G_2$ of the alternating voltage generator arrangement G may be selectively electrically connected to a remainder of the circuitry including the cords 23 of the suspension member 11. When such switches 41a, 41b are in their open states, the entire circuitry is set to an idle mode and is pulled up to a pull-up voltage via the pull-up voltage source 36.

Next, some deterioration states or even damage states in a suspension member 11 and ways for detecting such deterioration states with the device and method proposed herein will be described. For some of these cases, typically occurring voltages will be explained with reference to FIGS. 7 to 9.

i) Broken Cord

A critical state to be determined in a suspension member 11 is a case where at least one of the cords 23 comprised in the suspension member 11 is broken. Such broken cord may reduce the load bearing capacity of the suspension member 11 such that the suspension member 11 might have to be replaced.

In case a single cord 23 is broken or multiple cords comprised in either one of the first and second groups 24a, 24b of cords 23 are broken, an electrical connection between a respective first end 25a, 25b and an associated second end 27a, 27b of one of the groups 24a, 24b of cords is interrupted. Accordingly, the entire circuitry of the device 17 is open, i.e. there is no closed electrical circuit anymore, and no electrical current flows any more through the connecting electrical resistance $R_5$. As a result, both the third and the fourth voltages $U_3$, $U_4$ are same and follow the respective one of the generated voltages $U_{G1}$, $U_{G2}$ connected to the group of cords 24a, 24b that is not broken. Thus, the third voltage $U_3$ and the fourth voltage $U_4$ are in phase (i.e. no phase-shift any more) and have the same phase angle as the connected one of the alternating voltage generators $G_1$, $G_2$.

Figure 7:
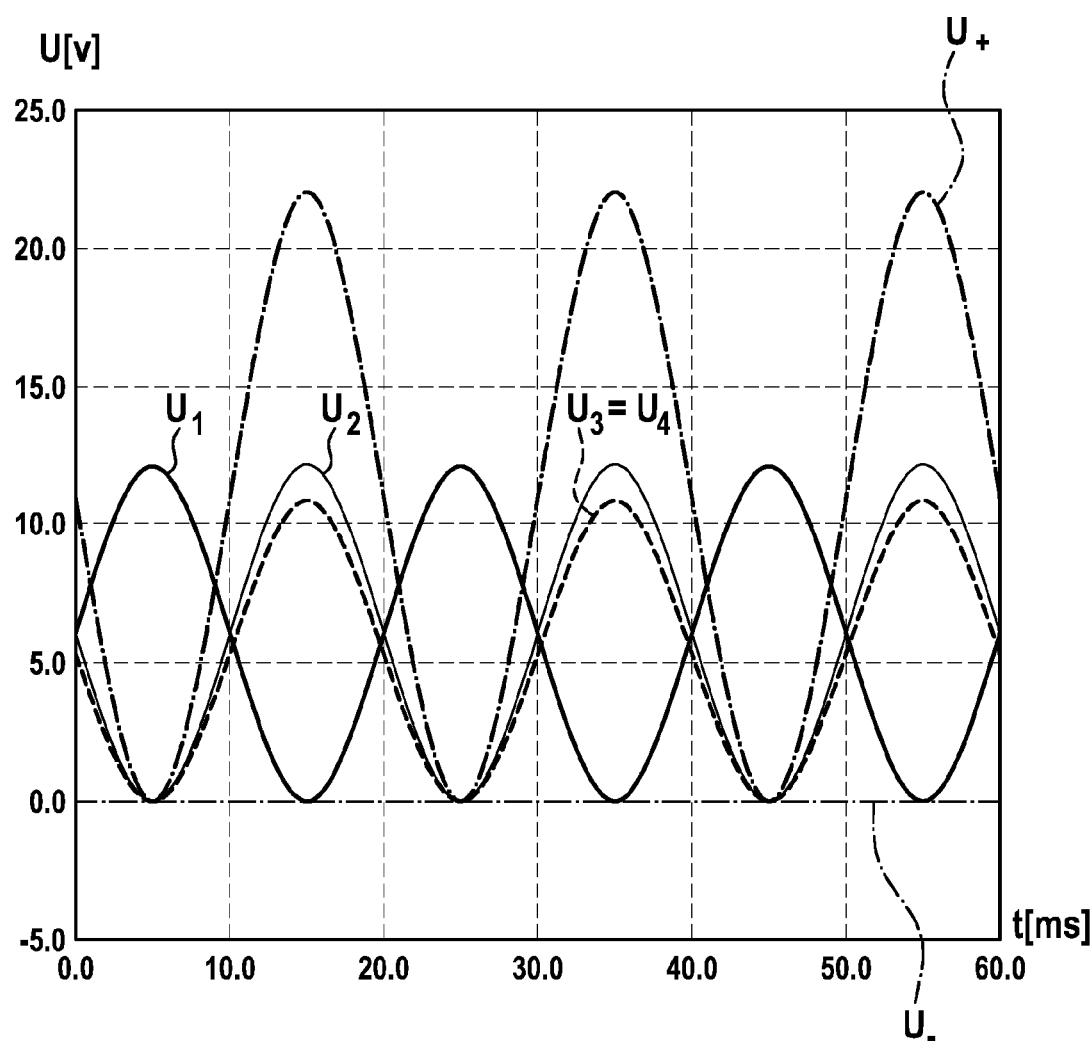
FIG. 7 shows time-dependent first and second voltages $U_1$, $U_2$ generated and applied at the first end of a suspension member and a resulting third and fourth voltages $U_3$, $U_4$ at the second end of the suspension member in a case where a cord in only one of the group of cords is broken.

The occurring voltages are shown in the diagram of FIG. 7. While the first and second voltages $U_1$, $U_2$ follow the generated alternating voltages $U_{G1}$, $U_{G2}$ (not visualized in FIG. 7 for simplification), it is assumed that at least one of the cords 23 comprised in the first group 24a of cords is broken whereas no cord 23 in the second group 24b of cords is broken such that the third and fourth voltages $U_3$, $U_4$ are same and follow the second alternating voltage $U_2$. Accordingly, in such case, the summed voltage $U_+$ will become an alternating voltage, i.e. the summed voltage $U_+$ has an alternating voltage component $U_{+,AC}$ being non-zero. In the example given herein, the summed voltage $U_+$ swings between $2*U_{max}$ and 0 V. Furthermore, the differential voltage $U_-$ will no more result in a signal and becomes substantially constantly 0 V.

ii) Suspension Member not attached or both Cord Groups Interrupted

Figure 8:
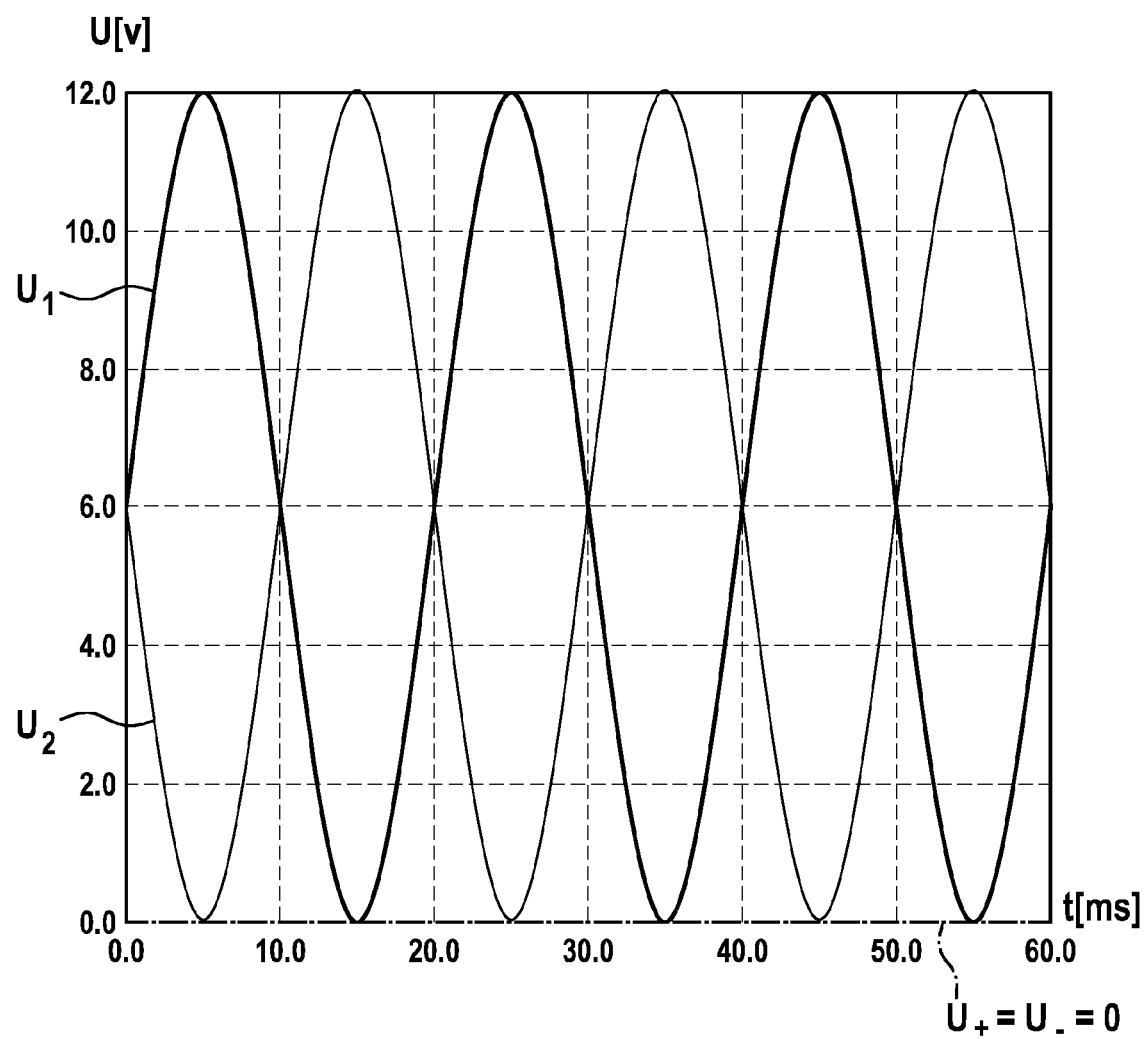
FIG. 8 shows the time-dependent voltages $U_1$, $U_2$, $U_3$, $U_4$ in a case where an electrical connection between the suspension member and an alternating voltage generator arrangement and/or measurement arrangements is interrupted or in a case where cords in both groups of cords are broken.

In a next case, it will be assumed that an electrical connection between components of the device 17 and the suspension member 11 is faulty or interrupted such that no voltages may be applied to the cords 23 comprised in the suspension member 11. A same or corresponding situation occurs when cords in not only one but in both groups 24a, 24b of cords are interrupted. In such cases, no electrical current flows through the connecting electrical resistance $R_5$. Instead, this connecting electrical resistance $R_5$ will be floating and both the third and fourth voltages $U_3$, $U_4$ will be measured as being constantly substantially 0 V. The first and second voltages $U_1$, $U_2$ will see no electrical load and may follow the generated voltages $U_{G1}$, $U_{G2}$ with their maximum voltage amplitude $U_{max}$. In such case, as indicated in FIG. 8, the summed voltage $U_+$ as well as the differential voltage $U_-$ will have no non-zero alternating voltage components $U_{+,AC}$, $U_{-,AC}$ and will generally become substantially constantly 0 V.

iii) Single Cord Connected to Ground

When a single cord 23 or only cords of one of the groups 24a, 24b of cords 23 are electrically connected to a ground potential (as indicated by a faulty first connection to ground 41), an electrical current will flow to ground. Accordingly, in such case of a single cord fault, an asymmetrical load to the alternating voltage generator arrangement G occurs. Since still electrical current flows through the connecting electrical resistance $R_5$, the third and fourth voltages $U_3$, $U_4$ generally both have the same phase and follow the alternating voltage generator $G_1$ or $G_2$ attached to the group $24a$, $24b$ of cords 23 not having the ground fault.

Figure 9:
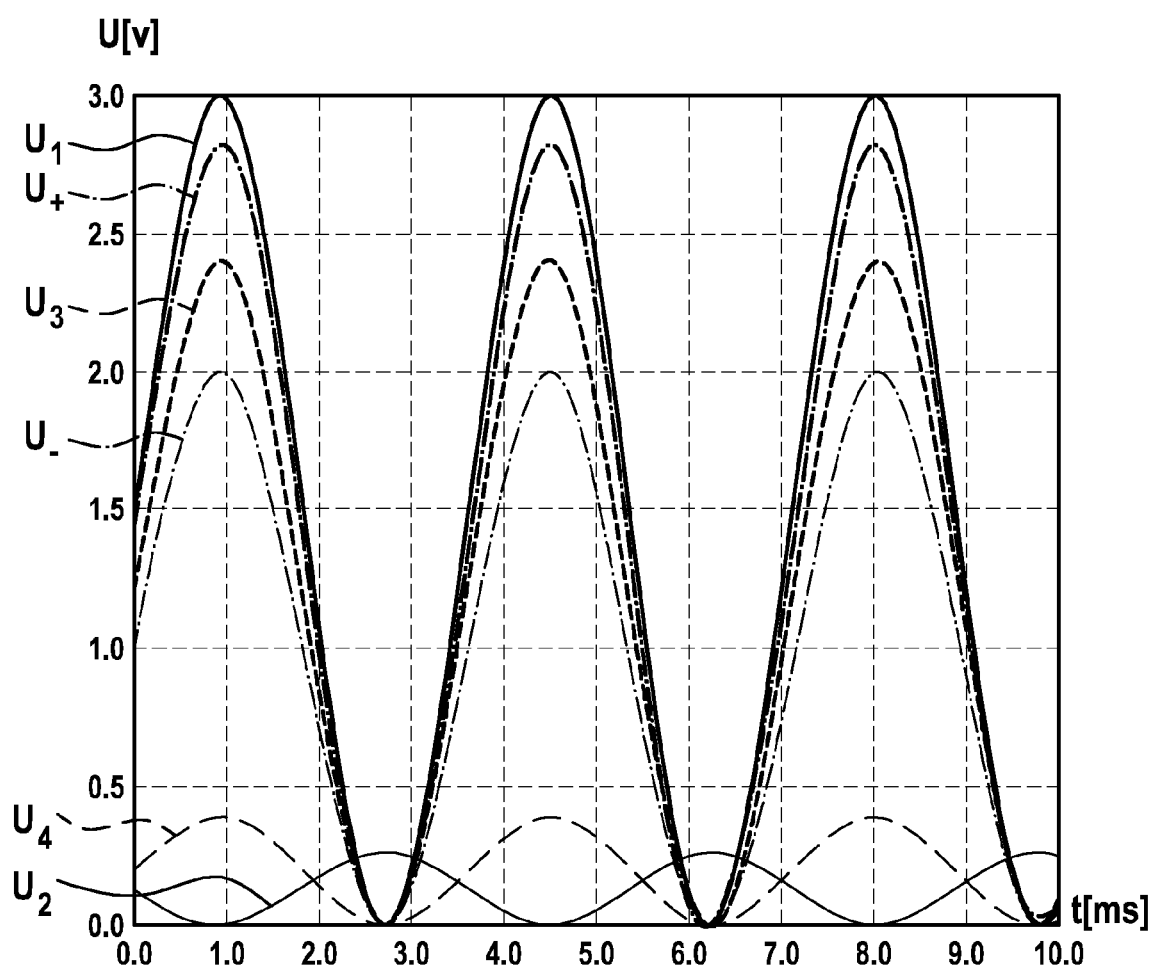
FIG. 9 shows time-dependent voltages $U_1$, $U_2$, $U_3$, $U_4$ in a case where one or more of the cords comprised in one of the groups of cords is electrically connected to ground.

FIG. 9 shows voltage conditions for a case in which a ground fault 43 is assumed to occur in the second group $24b$ of cords 23, i.e. between the second voltage $U_2$ and the fourth voltage $U_4$. In general, the voltage closer to the ground fault will have the smaller amplitude. Therefore, since the third and fourth voltages $U_3$, $U_4$ have different amplitudes but are in phase, both the summed voltage $U_+$ and the differential voltage $U_-$ will be sinusoidal signals, i.e. will have non-zero alternating voltage components $U_{+,AC}$, $U_{-,AC}$. Therein, the summed voltage $U_+$ will have a bigger sinusoidal signal than the differential voltage $U_-$.

iv) Cords in both Groups Connected to Ground

In case, cords 23 in each of the groups $24a$, $24b$ of cords are simultaneously connected to ground (as indicated by a faulty first connection to ground 41 and a faulty second connection to ground 43 in FIG. 3), both the third and fourth voltages $U_3$ and $U_4$ are substantially permanently 0 V. Accordingly, also the summed voltage $U_+$ and the differential voltage $U_-$ are substantially 0 V and no alternating voltage components $U_{+,AC}$, $U_{-,AC}$ can be detected.

Furthermore, in such case, electrical current may be flowing to ground such that electrical load will be put on the two alternating voltage generators $G_1$, $G_2$, thereby resulting in smaller first and second voltages $U_1$, $U_2$.

It may be noted that such a double or multiple ground connection generally only appears when the suspension member 11 runs for example over a grounded pulley.

Furthermore, it shall be noted that electrical connections to ground can either be permanent or may just occur when the elevator car is at certain locations, i.e. when the suspension member arrangement is moved along pulleys of the elevator and when for example a specific damaged location of the suspension member where the cords 23 are no more isolated by the cover 21 electrically comes into contact with the grounded pulley. It may therefore be necessary for specific embodiments of the detection method presented herein to move the suspension member arrangement along pulleys of the elevator during determining the summed voltage $U_+$ and the differential voltage $U_-$. In such cases, a position where at least one electrical connection to ground of one of the cords 23 is present may be determined based on a point in time where a respective deterioration state is determined.

In other words, when the summed voltage $U_+$ and the differential voltage $U_-$ are permanently monitored during displacing the elevator car and, suddenly, a significant change in the summed voltage $U_+$ and/or the differential voltage $U_-$ is detected, such change indicating that a single cord is connected to ground or several cords comprised in both groups of cords are connected to ground, a location where such ground connection occurs may be identified based on a point in time at which such change is detected. Therein, it may be used that, typically, an elevator control always knows precisely where the elevator car is currently situated and therefore it is known where the suspension members 11 of the suspension member arrangement 9 contact for example pulleys within the elevator arrangement. Accordingly, knowing the point in time when a ground connection is detected, the location of such ground connection within the suspension member 11 may be identified. In such identification, several influencing parameters such as a pulley diameter, an angle of wrap, a speed of the elevator and a roping factor may be taken into account.

Furthermore, for obtaining more detailed information about a single or multiple ground connections, various voltages may be measured and all first to fourth voltages $U_1$, $U_2$, $U_3$, $U_4$ may be permanently monitored and compared against their initial values. Both, in case of single ground failures as well as in case of multiple ground failures, these voltage values will be different when compared to the initial values. From the occurring voltage differences between actual values and initial values, additional information about the type, number and/or degree of electrical ground connections may be derived.

v) Shorts between Adjacent Cords

Another deterioration state to be detected may be a case in which neighboring cords 23 come into electrical contact with each other. This may occur for example when an isolating cover 21 is locally damaged and portions of one or more cords 23 are locally exposed. Then, either adjacent cords 23 may be getting into contact by mechanically touching each other directly or by both coming for example into contact with a conducting object such as a conductive pulley (which may be isolated from ground) such that the adjacent cords 23 come into indirect electrical contact. For the indirect adjacent connection of cords 23 via a pulley, it is obvious that the detection of the deterioration state should take place when the elevator moves, i.e. when the suspension member arrangement 9 is moved along the pulleys of the elevator.

As a result of such shorts between adjacent cords 23, an electrical current usually flowing through the connecting electrical resistance $R_5$ is bypassed by the fault. As a result, the third and fourth voltage $U_3$, $U_4$ will generally be the same since they measure a connection point voltage to ground and therefore the differential voltage $U_-$ will generally be zero.

Generally, two types of shorts between adjacent cords 23 may be distinguished. In a first situation named herein "symmetrical short" 45 (as visualized as a broken line in FIG. 3), an electrical connection occurs between a first cord comprised in the first group $24a$ of cords and a second cord comprised in the second group $24b$ of cords at a location where the lengths of both the first and second cords up to the location of the shunt (or a series connection of cords comprising each of the cords in one of the groups $24a$, $24b$ up to the location of the shunt) are same for both the first and second cords. In other words, in a situation where the first group $24a$ of cords is formed by all odd numbered cords and the second group of cords $24b$ is formed by all even numbered cords, the symmetrical situation exists if the number of odd and even cords up to the fault is the same. In such symmetrical situation, the alternating voltage component of the applied voltages generally disappears in the connection point and the connection point will have a DC voltage of generally $U_{max}/2$. Accordingly, in such symmetrical situation, the summed voltage $U_+$ will have no alternating voltage component, i.e. $U_{+,AC}=0$, and will have a direct voltage component generally corresponding to the applied maximum voltage, i.e. $U_{+,DC}=U_{max}$.

In an asymmetrical situation called herein "asymmetrical shunt" 47 (as indicated in FIG. 3), an electrical connection occurs between neighboring cords at a location where a distance between this location and a first end $25a$ for the cord 23 comprised in the first group $24a$ is different from a distance of such location from the first end $25b$ of the cord 23 comprised in the second group $24b$. In other words, in the example mentioned above, the asymmetrical situation exists if the number of odd and even cords to the fault is not the same. In such asymmetrical situation, the asymmetry will create an alternating voltage component in the connection point versus ground. Both the third and fourth voltages $U_3$, $U_4$ will measure this voltage of the connection point and will therefore be in phase having the same phase angle as the one of the generators $G_1$, $G_2$ being closer to the fault. Additionally to such alternating voltage component, the third and fourth voltages $U_3$, $U_4$ will have a DC voltage of generally $U_{max}/2$. Accordingly, the summed voltage $U_+$ will have a direct voltage component $U_{+,DC}$ corresponding to the maximum voltage, i.e. $U_{+,DC}=U_{max}$, and an alternating voltage component $U_{+,AC}$ being non-zero.

vi) Damaged but Non-Interrupted Cords (Corrosion/Rust)

A load bearing capacity of a suspension member 11 may, inter alia, be deteriorated when cords 23 within the suspension member 11 are for example corroded. Rusty locations at the cords 23 may reduce their cross-section thereby reducing their load bearing capacity. It is generally assumed that such corrosion not only decreases mechanical properties of the suspension member 11 but also changes its electrical properties. Particularly, it may be assumed that a diameter of a cord reduced by corrosion generally results in a reduced electrical conductivity through such cord.

When the suspension member 11 is included into the device 17 proposed herein, such reduced electrical conductivity in at least one of the cords 23 may significantly change at least some of the first to fourth voltages $U_1$, $U_2$, $U_3$, $U_4$. Accordingly, these voltages may be measured for example in an initial state of the suspension member arrangement 9 and measured initial reference values may be stored e.g. once a new suspension member arrangement got installed and put into operation. During subsequent operation of the elevator, some or all of these first to fourth voltages $U_1$, $U_2$, $U_3$, $U_4$ may be measured and compared to the initial reference values.

Detected differences may show different patterns. For example, when all values actually measured changed in a same manner when compared to the initial reference values, it may be assumed that a homogeneous damage or deterioration, i.e. for example a homogeneous corrosion, occurred to all of the cords 23. Alternatively, if it is observed that some of the actually measured values have changed with respect to the initial reference values but other measured values have not changed, it may be assumed that just certain cords or connection points are faulty.

For completeness, it shall be indicated that, additionally to a measurement mode in which the device 17 may perform a method for detecting various deterioration states as described herein before, the device 17 may also be set into a so-called "idle mode".

Figure 10:
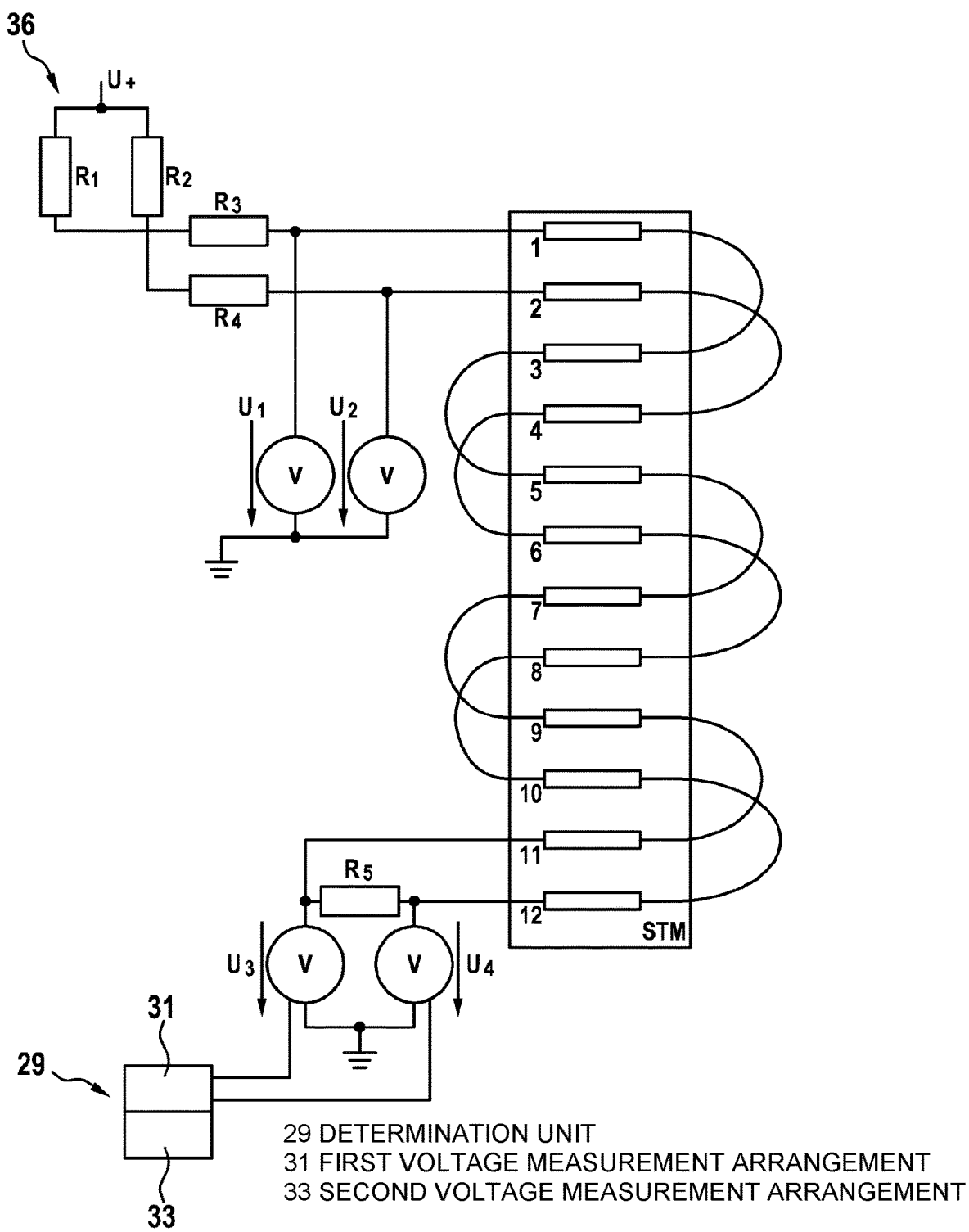
FIG. 10 depicts a measurement arrangement of FIG. 3 in an idle mode.

Such idle mode is visualized in FIG. 10. Therein, the alternating voltage generator arrangement G can also be switched off. Alternatively, the alternating voltage generators $G_1$, $G_2$ may be disconnected from the rest of the circuitry via switches similar to those switches 41a, 41b shown in FIG. 6. The device 17 may be set to such idle mode for example in order to save energy when no measurement is required. Alternatively, when a suspension member arrangement 9 comprises more than one suspension member 11, a device 17 may be provided for each of the suspension members 11 and one of such plurality of devices 17 may be set into its idle mode while another one of the devices 17 is currently in its measurement mode. As a further alternative, a single alternating voltage generator arrangement G may be provided and may be alternately electrically connected to each one of the plurality of suspension members 11 for performing the detection method in this one suspension member 11 while other suspension members 11 are set into an idle mode. In such idle mode, it may be interpreted that the alternating voltage generators $G_1$, $G_2$ have a high impedance output (and can therefore be ignored in the schematic diagram of FIG. 10) and, since no electrical current flows due to voltage applied by the voltage generators $G_1$, $G_2$, the pull-up voltage source 36 will lift up all of the first to fourth voltages $U_1$, $U_2$, $U_3$, $U_4$ to generally $U_{max}$.

However, in case of deteriorations occurring in the suspension members 11, such voltages $U_1$, $U_2$, $U_3$, $U_4$ may change. For example, when electrical connections to ground occur at one or more of the cords 23, currents may flow to ground and depending on where the connection to ground occurs, one or more of the first to fourth voltages $U_1$, $U_2$, $U_3$, $U_4$ may change and, particularly, may be less than $U_{max}$.

Summarizing, various deterioration states to be detected with the device 17 and the method described herein may be identified as follows:

a state in which the summed voltage $U_+$ comprises an alternating voltage component (i.e. $U_{+,AC} \neq 0$) and the differential voltage $U_-$ comprises no alternating voltage component (i.e. $U_{-,AC}=0$) may be interpreted as indicating that at least one of the cords 23 comprised in one of the group of cords 24a, 24b is interrupted and none of the cords 23 comprised in the other group of cords 24b, 24a is interrupted;

a state in which the summed voltage $U_+$ comprises no alternating voltage component (i.e. $U_{+,AC}=0$) and the differential voltage $U_-$ comprises no alternating voltage component (i.e. $U_{-,AC}=0$) may be interpreted as indicating at least one of the following deterioration states:
either: at least one of the cords comprised in one of the groups of cords is interrupted and at least one of the cords comprised in the other group of cords is also interrupted, or: the voltage supplies applying the first alternating voltage $U_1$ and the second alternating voltage $U_2$ are both interrupted;

a state in which the summed voltage $U_+$ comprises an alternating voltage component (i.e. $U_{+,AC} \neq 0$) and the differential voltage $U_-$ comprises an alternating voltage component (i.e. $U_{-,AC} \neq 0$) is interpreted as indicating an electrical connection to ground of at least one of the cords 23 in the suspension member 11;

a state in which the summed voltage $U_+$ comprises no alternating voltage component (i.e. $U_{+,AC}=0$) but a direct voltage component (i.e. $U_{+,DC} \neq 0$) and the differential voltage $U_-$ comprises no alternating voltage component (i.e. $U_{-,AC}=0$) is interpreted as indicating that one of the cords 23 comprised in one of the groups 24a, 24b of cords is short-circuited with a cord 23 comprised in the other group 24b, 24a of cords in a symmetrical manner;

a state in which the summed voltage $U_+$ comprises an alternating voltage component (i.e. $U_{+,AC} \neq 0$) and a direct voltage component (i.e. $U_{+,DC} \neq 0$) and the differential voltage $U_-$ comprises no alternating voltage component (i.e. $U_{-,AC}=0$) is interpreted as indicating that one of the cords 23 comprised in one of the groups 24a, 24b of cords is short-circuited with a cord 23 comprised in the other group 24b, 24a of cords in an asymmetrical manner.

Particularly, it has been found that information about the deterioration state may advantageously be derived based on an analysis of a phase in an alternating voltage component $U_{+,AC}$, $U_{-,AC}$ of at least one of the summed voltage $U_+$ and the differential voltage $U_-$. In other words, when analyzing the summed voltage and/or the differential voltage, also phase angles of the third voltage and the fourth voltage $U_3$, $U_4$ and/or of the first voltage and the second voltage $U_1$, $U_2$ (or a mathematical combination thereof) may be considered for simplifying a diagnostics.

Furthermore, for obtaining further detailed information about a current deterioration state, initial values of the summed voltage $U_+$ and/or the differential voltage $U_-$ may be determined and stored in an initial state of the elevator and subsequent values of the summed voltage $U_+$ and the differential voltage $U_-$ may be determined in a subsequent state of the elevator (i.e. during normal operation thereof). The deterioration state of the suspension member may then be determined during the subsequent state based on a comparison of the initial values of the summed voltage $U_+$ and the differential voltage $U_-$ with the subsequent values of these summed and differential voltages $U_+$, $U_-$, respectively.

Furthermore, for obtaining additional information about the deterioration state, initial values of the applied first and second alternating voltages $U_1$, $U_2$ may be determined and stored in an initial state of the elevator and subsequent values (e.g. during normal operation) of the applied first and second alternating voltages $U_1$, $U_2$ may be determined in a subsequent state of the elevator. Therein, the deterioration state of the suspension member may be determined during the subsequent state taking into account a comparison of the initial values of the applied first and second alternating voltages $U_1$, $U_2$ with the subsequent values of the applied first and second alternating voltages $U_1$, $U_2$, respectively.

A brief overview of various possibilities of error detection or deterioration detection in a measurement mode of the device 17 may be obtained from the following chart:

the present invention. While the method steps including analyzing steps and decision steps and the resulting indications about detected various types of deterioration states are self-explaining from the flow-chart, it shall be mentioned that this flow-chart visualizes only one possibility for implementing the method according to the invention. Various further possibilities exist for performing the method steps including the analyzing steps and the decision steps. Particularly, each of the steps may be further specified in order to enable determining more detailed information about a deterioration state. For example, additional phase analysis of alternating voltage components of one or more of the first to fourth alternating voltages and/or the summed voltage and/or the differential voltage may provide such additional information.

Next, some structural and/or functional details of possible embodiments of the device 17 for detecting the deterioration state will be described.

As indicated with reference to the embodiment shown in FIG. 3, it may be sufficient that the device 17 comprises either the first voltage measurement arrangement 31 for determining the summed voltage $U_+$ or the second voltage measurement arrangement 33 for determining the differential voltage $U_-$. In principle, from each of the summed voltage $U_+$ and the differential voltage $U_-$, valuable information about a current deterioration state may be determined. However, it may be advantageous to provide the device 17 with both the first voltage measurement arrangement 31 and the second voltage measurement arrangement 33.

|  | $U_+$ | | $U_-$ | | Phase angles | | |
| --- | --- | --- | --- | --- | --- | --- | --- |
|  | AC | DC | AC | DC | $U_3$ | $U_4$ | Comment |
| OK | No signal | ~½ $U_{max}$ | Sinusoidal signal | 0 V | $G_1$ | $G_2$ |  |
| Broken cord | Sinusoidal signal 2$U_{max}$ peak to peak | $U_{max}$ | No signal | 0 V |  | $G_x$ $x$ side still connected | No load on $U_1$ and $U_2$ |
| STM not attached or both cord pairs broken | No signal | 0 V | No signal | 0 V | — | — | No load on $U_1$ and $U_2$ |
| Multiple connections to ground (measurement mode) | No signal | 0 V | No signal | 0 V | — | — | Load on $U_1$ and $U_2$ Elevator must move to detect all faults |
| Single connection to ground (measurement mode) | Sinusoidal signal | <=½ $U_{max}$ | Sinusoidal signal <= $U_3 + U_4$ | <=½ $U_{max}$ |  | $G_x$ $x$ side not having ground fault | Elevator must move to detect all faults |
| Adjacent connection of cords (symmetrical) | No signal | $U_{max}$ | No signal | 0 V | — | — | Elevator must move to detect all faults |
| Adjacent connection of cords (asymmetrical) | Sinusoidal signal | $U_{max}$ | No signal | 0 V |  | $G_x$ $x$ side of the generator being closer to the fault | Load on $U_1$ and $U_2$ Elevator must move to detect all faults |
| Damaged cords |  |  | Deviation from initial values |  |  |  |  |

Figure 11:
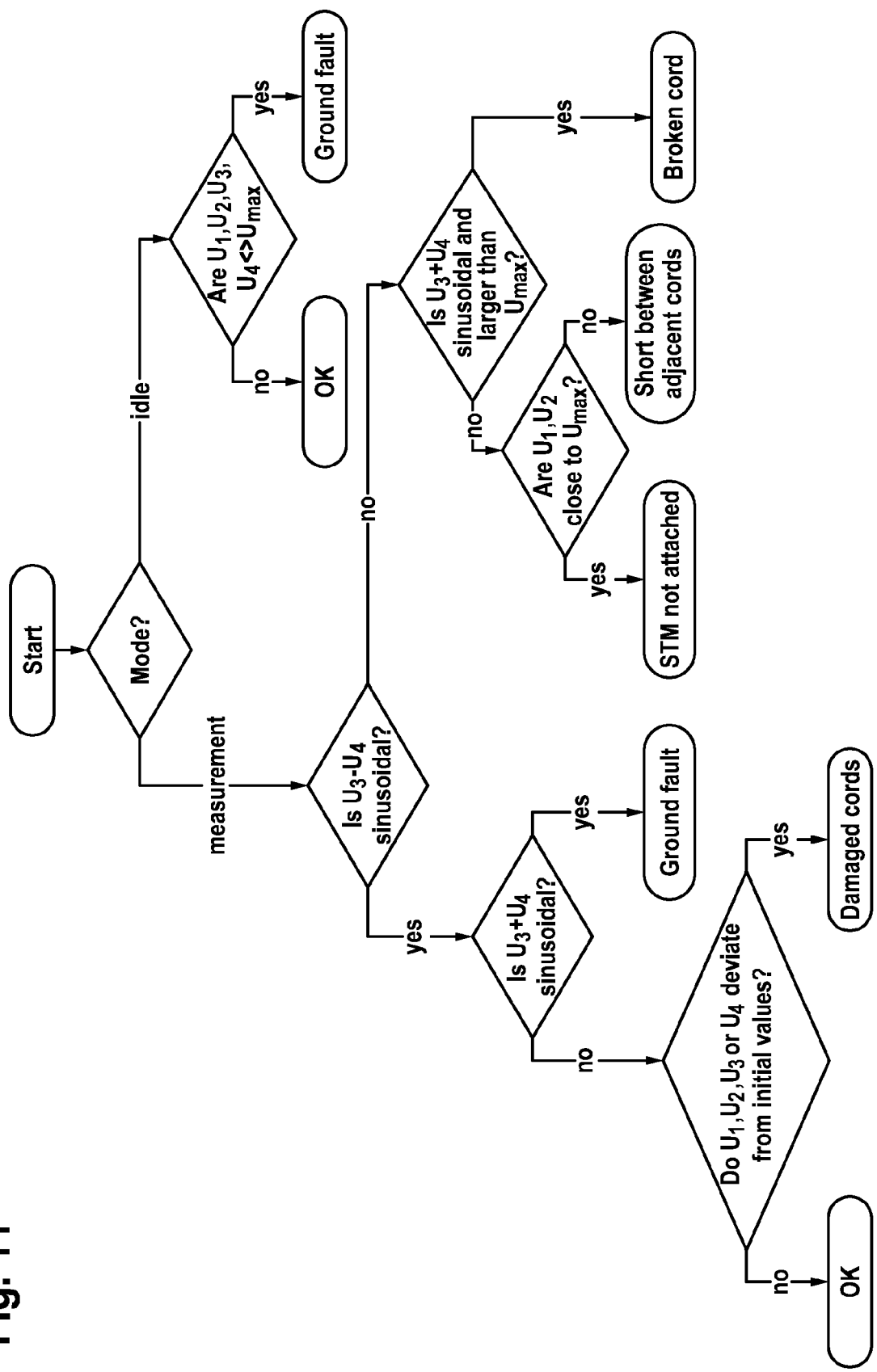
FIG. 11 shows the flowchart visualizing various voltage measurement results and their correlation to various possible cases of suspension member deterioration.

FIG. 11 shows a flow-chart indicating method steps and their temporal and/or logical interconnection in a method for determining a deterioration state in a suspension member arrangement of an elevator according to an embodiment of Each or at least one of the first voltage measurement arrangement 31 and the second voltage measurement arrangement 33 may be adapted for measuring at least an alternating voltage component $U_{+,AC}$ of the summed voltage $U_+$ or an alternating voltage component $U_{-,AC}$ of the differential voltage $U_-$. However, additional information may be acquired if additionally to such ability for measuring the alternating voltage component, the first voltage measurement arrangement 31 and/or the second voltage measurement arrangement 33 are also adapted for measuring a direct voltage component $U_{+,DC}$ of the summed voltage and/or $U_{-,DC}$ of the differential voltage $U_-$.

Furthermore, it may be beneficial to provide the first voltage measurement arrangement 31 and/or the second voltage measurement arrangement 33 with a transformation unit which is adapted for transforming a voltage measurement from a time domain into a frequency domain. For example, such transformation unit may be adapted for performing a Fast Fourier Transformation (FFT). Alternatively, the transformation unit may be adapted for performing other transformations which enable transforming a time-dependency of a voltage periodically varying over time into a frequency domain. Accordingly, any change in a frequency of an alternating voltage component may be easily identified in the representation of the alternating voltage component in the frequency domain. Furthermore, it may also be possible to detect any phase-shift in such alternating voltage component. Detected changes in a frequency or a phase-shift of alternating voltage components $U_{+,AC}$, $U_{-,AC}$ of the summed voltage $U_+$ and/or the differential voltage $U_-$ may therefore easily be identified and taken as indicating specific types or degrees of deterioration in a suspension member.

Furthermore, the first voltage measurement arrangement 31 and/or the second voltage measurement arrangement 33 may comprise a frequency filter for transmitting only alternating voltage components with a specific frequency spectrum. For example, only alternating voltage components with a frequency corresponding to a frequency of the first alternating voltage $U_1$ may be transmitted.

For example, such frequency filter may be a band-pass filter. Such band-pass filter may filter-out specific high and/or low frequencies and/or frequency-bands. Accordingly, when analyzing any changes in the alternating voltage components of e.g. the summed voltage $U_+$ or the differential voltage $U_-$, signals representing such alternating voltage components may first be filtered such that only those frequencies are actually analyzed which provide important information about the deterioration state of the suspension member, such frequencies typically corresponding to the frequencies of the generated voltages $U_{G1}$, $U_{G2}$. Other frequency components such as for example high frequency components being unintendedly coupled into the voltage measurement signals may be filtered out. Thus, using such frequency filter, alternating voltage components of a measured voltage may be analyzed in a simplified manner.

The alternating voltage generator arrangement G, possibly with its alternating voltage generators $G_1$, $G_2$, may comprise at least one microcontroller generating an alternating voltage using pulse width modulation (PWM). Such PWM microcontroller may generate digital or, preferably, binary signals which may be used for example for controlling transistors. Possibly, a first PWM microcontroller may generate the signals for generating the first generated alternating voltage $U_{G1}$ whereas a second microcontroller (or alternatively an inverted output port of the same microcontroller) may generate the signals for generating the second alternating generated voltage $U_{G2}$. By suitably turning on and off for example two transistors with a first PWM signal and a second inverted PWM signal, suitable digital PWM signals may then be transmitted through a low-pass filter in order to, finally, generate an analog generated alternating voltage $U_{G1}$ or $U_{G2}$. The low-pass filters might be implemented as RC filters containing e.g. the two capacitors 39a and 39b and the two resistors $R_3$ and $R_4$ as depicted in FIG. 6.

Preferably, the alternating voltage generator arrangement G, possibly with its alternating voltage generators $G_1$, $G_2$, may be adapted for generating an alternating voltage with a frequency that is neither an integer multiple nor an inverse integer multiple of one of 50 Hz and 60 Hz. In other words, it may be preferable that the voltage generator arrangement generates the alternating voltage with a frequency which is substantially different to the frequency of a typical alternating power supply voltage. Expressed differently, the alternating voltage generators should use a frequency that is different from 50 Hz and 60 Hz and their harmonics. Thereby, measurements of the alternating voltage components may be made robust and immune against any EMC effects which otherwise could disturb the proposed method for detecting the deterioration state in the elevator. Furthermore, particularly when the frequency of the voltage generators significantly differs from any frequency of the power supply voltage, for example a Fast Fourier Transformation or similar algorithm may be used to transform the measured alternating voltage from its time domain into a frequency domain. In such frequency domain, only the frequency matching the alternating voltage generator's frequency may be considered. Furthermore, phase angles of the voltage measurement signal may be detected in order to determine the source generator $G_1$ or $G_2$.

Next, an implementation of the device 17 for an elevator having a suspension member arrangement 9 comprising a multiplicity of suspension members 11 will be described.

Typically, a suspension member arrangement 9 for an elevator comprises at least two, preferably three, four or more suspension members 11 such as multiple separate belts in order to securely suspend the elevator car and/or the counterweight. The device 17 may be adapted for detecting deterioration states in each of such multiple suspension members 11. Therein, in order to save device resources and costs, some components of the device 17 may not be provided for each of the suspension members 11 but, instead, are provided only once and are therefore to be shared for detecting the deterioration state in each of the multiple suspension members 11. For example, the device 17 may comprise a power supply, a microcontroller and its software, alternating voltage generators, analog/digital converters and/or serial communication interfaces to an elevator controller. Therein, such components may be provided only once and may be shared for all of the suspension members 11.

Figure 12:
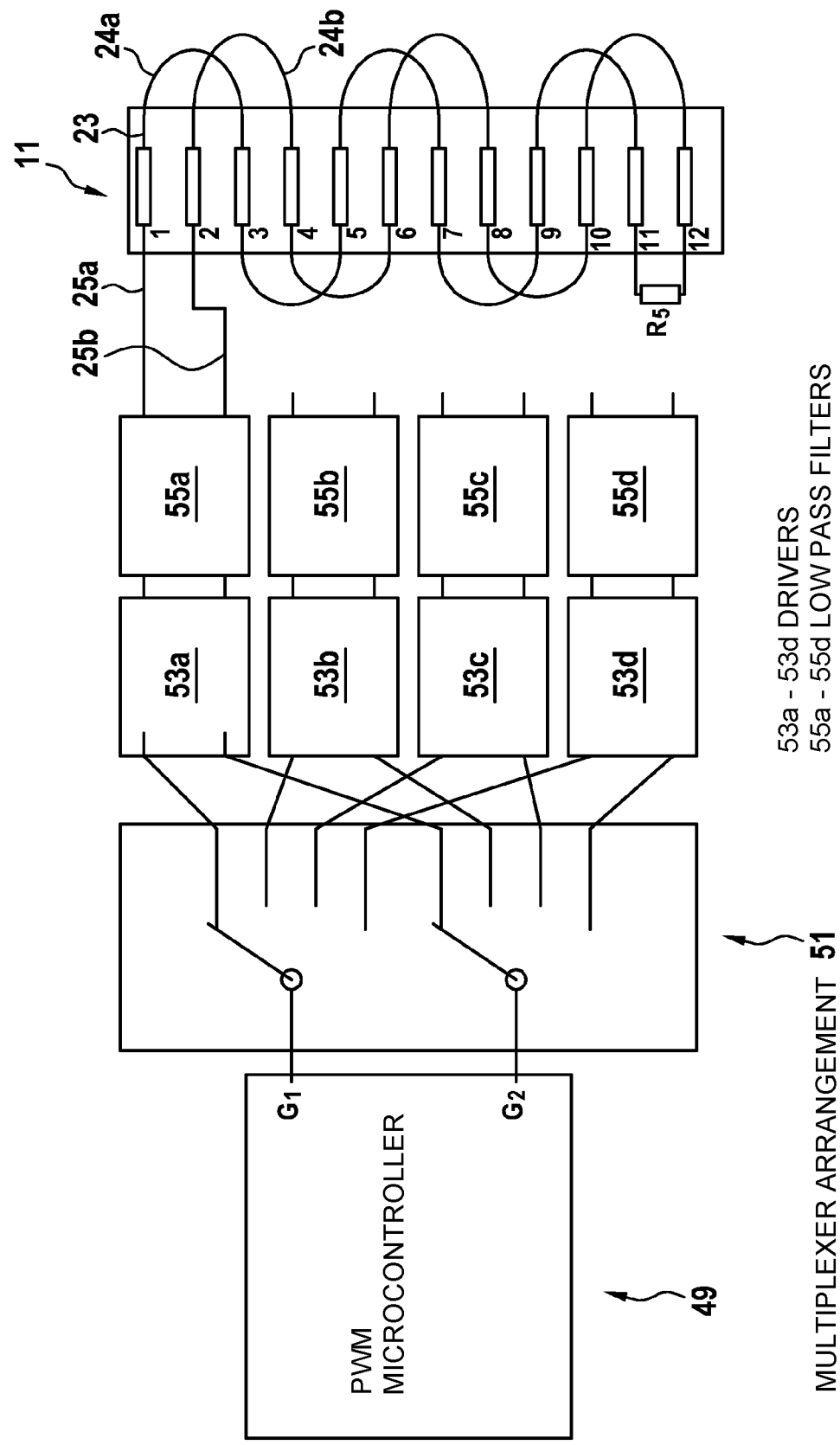
FIG. 12 shows a device for detecting the deterioration state in a suspension member arrangement comprising multiple suspension members according to an embodiment of the invention disclosed in the priority documents.

As shown in principle in FIG. 12, a multiplexer arrangement 51 may be connected for example to a PWM microcontroller 49 forming the first and second alternating voltage generators $G_1$, $G_2$. This multiplexer arrangement 51 may be a digital multiplexer. The multiplexer arrangement 51 may be adapted for connecting the alternating voltage generator arrangement G and/or at least one of the first and second voltage measurement arrangements 31, 33 to each of exemplarily four multiple suspension members 11 in a timely offset sequence. For such purpose, the multiplexer arrangement 51 may establish an electrical connection to each of a multiplicity of drivers 53a, 53b, 53c, 53d in a serial time sequence, i.e. one after the other. Each of the drivers 53a, 53b, 53c, 53d is then connected to an associated low-pass filter 55a, 55b, 55c, 55d which is then finally connected to one of the multiple suspension members 11 in order to apply the first and second alternating voltages $U_1$, $U_2$ to the first ends 25a, 25b of the first and second groups 24a, 24b of cords 23 comprised therein.

Figure 13:
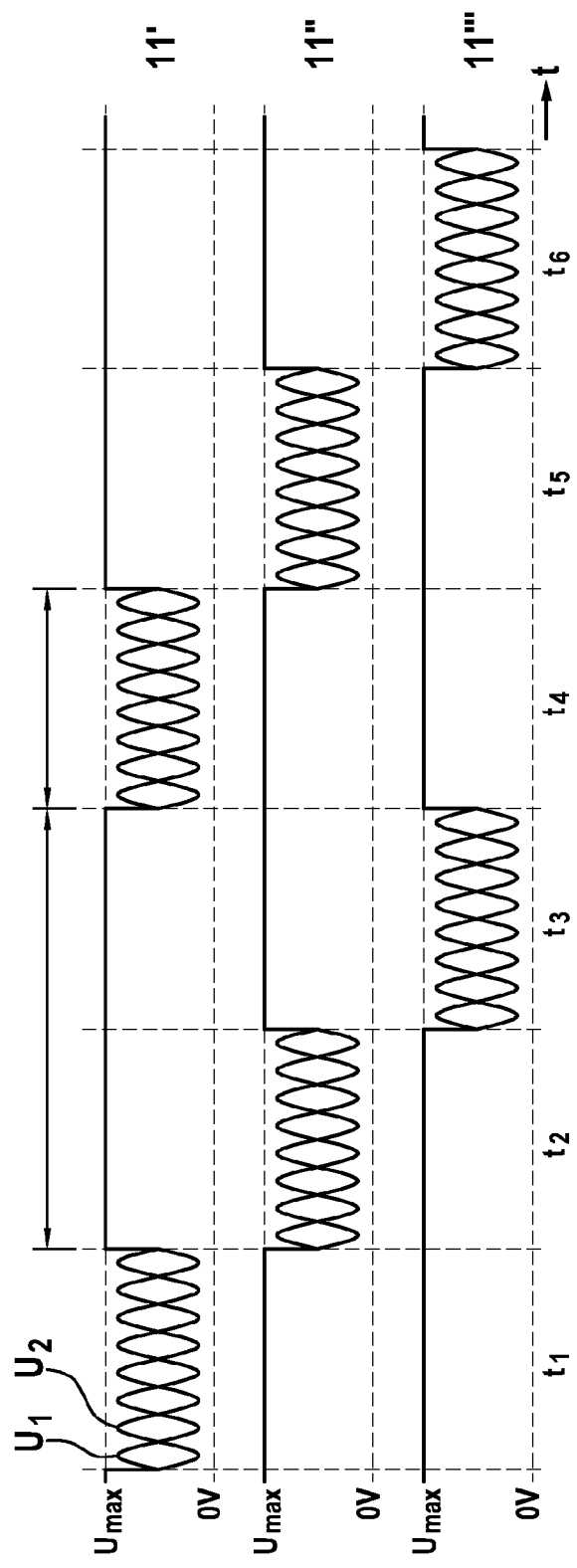
FIG. 13 shows a time dependence in the method for determining deterioration states in the suspension member arrangement comprising multiple suspension members according to an embodiment of the invention disclosed in the priority documents.
Figure 14:
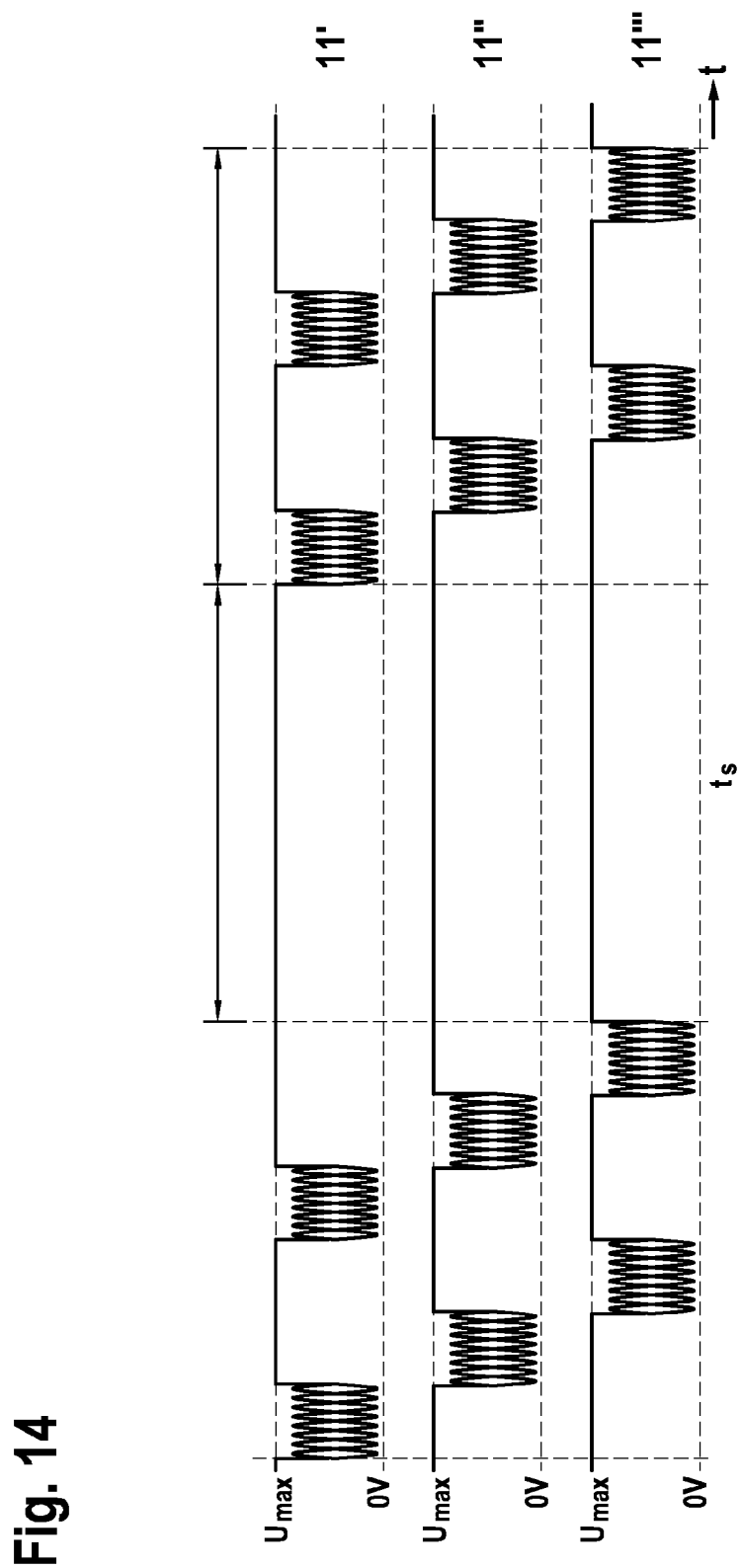
FIG. 14 shows a time dependence in the method for determining deterioration states in the suspension member arrangement comprising multiple suspension members according to an alternative embodiment of the invention disclosed in the priority documents.

FIGS. 13 and 14 show timing diagrams for non-continuous detection of deterioration states in a multiplicity of suspension members 11. The diagrams show a time dependence of the first and second alternating voltages $U_1$, $U_2$ applied to groups 24a, 24b of cords 23 in each of three exemplary suspension members.

Therein, as shown in FIG. 13, first and second alternating voltages $U_1$, $U_2$ are applied to a first suspension member 11' during a first period of time t1 using the multiplexer arrangement 51. During such first period t1, the other suspension members 11", 11''' are not connected to the alternating voltage generator arrangement G and are therefore in an idle mode in which the pull-up voltage $U_{max}$ is constantly applied to each of the groups of cords comprised in these suspension members. Accordingly, during the period t1, voltage measurements may be performed indicating a deterioration state in the first suspension member 11'. Then, in a subsequent period of time t2, the multiplexer arrangement 51 switches over to the second suspension member 11". Accordingly, during such second period t2, alternating voltages $U_1$, $U_2$ are applied to the cords 23 in the second suspension member 11" and resulting measured summed voltages and differential voltages may be analyzed for determining the deterioration state in this second suspension member 11". Subsequently, the multiplexer arrangement 51 switches over to the third suspension member 11''' and repeats the measurement procedure in a time period t3 for this third suspension member 11'''. Finally, the multiplexer arrangement 51 may switch back to the first suspension member 11' and start a new sequence of measurement procedures in time periods t4, t5, t6.

As shown in FIG. 14, after having measured and detected deterioration states in all of the suspension members 11', 11", 11''', the detecting device 17 may be set into a sleep mode in which all suspension members 11', 11", 11''' are in an idle mode. Thereby, energy may be saved. After a sleep time $t_s$ of for example several seconds, several minutes or even several hours, a next measurement sequence may be started by sequentially connecting an activated alternating voltage generator arrangement to each of the multiple suspension members 11', 11", 11''' in a timely offset manner.

Figure 15:
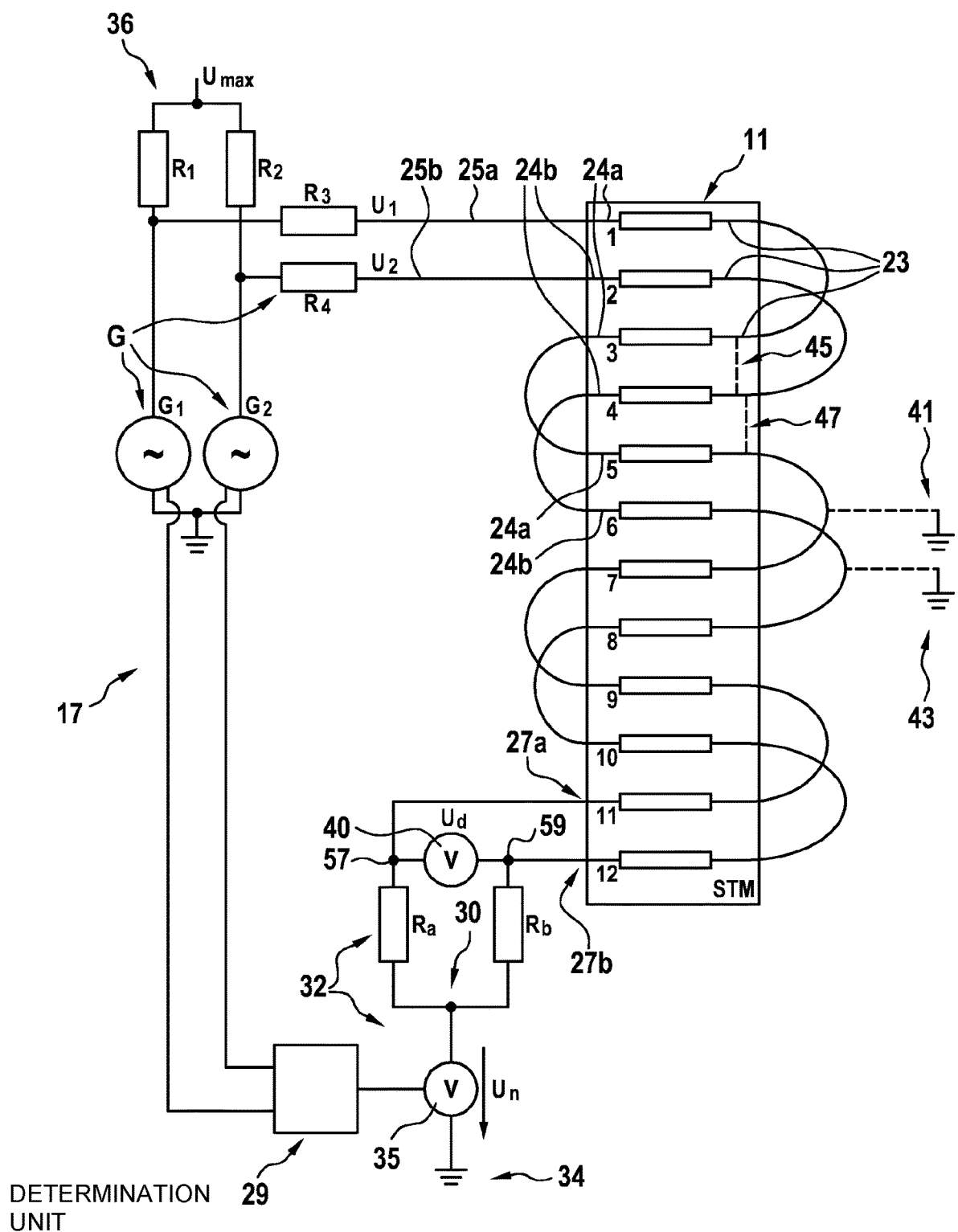
FIG. 15 shows a measurement arrangement to be applied in the method for detecting the deterioration state in the suspension member arrangement according to an alternative embodiment of the present invention.

FIG. 15 shows a device 17 in accordance to an embodiment of the present invention for detecting a deterioration state in a suspension member arrangement including at least one suspension member 11. The present device 17 is similar to the preceding embodiments of devices shown in FIG. 3, 5 or 6 and many of the features and characteristics described above with respect to these devices may be implemented in the present device 17 of FIG. 15 in a same or similar manner.

However, in comparison to the devices shown in FIG. 3, 5 or 6, the present device 17 of FIG. 15 is less complex. Particularly, it comprises only two voltage determining units, i.e. the neutral point voltage determining unit 35 and the difference voltage determining unit 40, instead of the plural voltage determining units 35a-d included in the preceding embodiments. While, due to its reduced complexity, the present device 17 may or may not determine all types of possible failures or deteriorations in the suspension member 11 with a same accuracy and/or reliability as in the more complex preceding embodiments, it nevertheless allows determining failures or deteriorations of major importance with a high accuracy and reliability.

Particularly, the present device 17 may, despite its reduced complexity and therefore possible reduced costs, determine major non-uniform deteriorations such as interrupted cords 23, shorted cords 23 or cords 23 with faulty connections to ground 41. Furthermore, the present device 17 may determine uniform deteriorations such as corrosion to the cords 23 which result in a general increase of electrical resistances homogeneously for all of the cords 23 in the suspension member 11.

In more detail, in the present device 17, there are no first and second voltage determining units 35a, 35b at the first ends 25a, 25b of the first and second groups of cords 24a, 24b. The present device 17 comprises only the neutral voltage determining unit 35 and the difference voltage determining unit 40.

The neutral voltage determining unit 35 is electrically connected between a neutral point 30 and an electrical reference potential 34 such as an electrical ground. Therein, the neutral point 30 is electrically connected to both, the second end 27a of the first group 24a of cords as well as to the second end 27b of the second group 24b of cords via intermediate first and second resistors $R_a$, $R_b$, respectively. Specifically, the neutral point 30 is arranged such that overall electrical resistances between the neutral point 30 and each of the voltage generators $G_1$ and $G_2$ are equal. In other words, a first overall electrical resistance including the electrical resistance of all of the cords 23 comprised in the first group 24a of cords 23 connected in series as well as the optional internal electrical resistance devices $R_3$ and the first resistor $R_a$ is substantially equal to a second overall electrical resistance including the electrical resistance of all of the cords 23 comprised in the second group 24b of cords 23 connected in series as well as the optional internal electrical resistance devices $R_4$ and the second resistor $R_b$.

The neutral voltage determining unit 35 is adapted for measuring neutral point voltages $U_n$ between the neutral point 30 and the reference potential 34. Such measured neutral point voltages $U_n$ may then be provided to and analyzed in a determination unit 29.

The difference voltage determining unit 40 is connected between a first difference measurement point 57 and a second difference measurement point 59. The first difference measurement point 57 is located upstream of the first resistor $R_a$, i.e. between the second end 27a of the first group 24a of electrically conductive cords 23 and the first electrical resistor $R_a$, whereas the second difference measurement point 59 is located upstream of the second resistor $R_b$, i.e. between the second end 27b of the second group 24b of electrically conductive cords 23 and the second electrical resistor $R_b$. Accordingly, the first and second difference measurement points 57, 59 are electrically separated from each other by the intermediate first and second resistors $R_a$, $R_b$. On the other hand, the first and second difference measurement points 57, 59 are electrically connected to the first and second voltage generators $G_1$, $G_2$, respectively, via the cords 23 of the first and second group, respectively. Accordingly, the first and second voltages $U_1$, $U_2$ applied to these groups of cords at their first ends 25a, 25b will be forwarded to their second ends 27a, 27b and to the first and second difference measurement points 57, 59 after having been diminished by voltage drops due to resistance losses throughout the cords 23 in the first and second group 24a, 24b of cords, respectively. Thus, the difference voltage $U_d$ sensed by the difference voltage determining unit 40 is sensitive to any resistance changes throughout the groups 24a, 24b of cords resulting from uniform deteriorations. Such measured difference voltages $U_d$ may then also be provided to and analyzed in a determination unit 29.

Upon performing a method for detecting a deterioration state in the suspension member arrangement 9 in accordance with an embodiment of the present invention, both alternating voltage generators $G_1$, $G_2$ may be controlled such that a first alternating voltage $U_1$ is applied to the first end 25a of the first group 24a of cords of the suspension member 11 and a second alternating voltage $U_2$ is applied to the second end 25b of the second group 24b of cords of the suspension member 11 with both alternating voltages $U_1$, $U_2$ having same waveforms but being shifted against each other with a phase difference of 180°.

Upon having applied such symmetric first and second alternating voltages $U_1$, $U_2$, the voltage determining unit 35 measures the neutral point voltage $U_n$. As long as no significant deteriorations or failures occur within the cords 23 of the suspension member 11, such neutral point voltage $U_n$ should comprise no alternating voltage component due to the fact that, at the neutral point 30, both the alternating voltage applied by the first voltage generator $G_1$ and the second voltage applied by the second voltage generator $G_2$ compensate each other due to their same amplitudes and 180° phase shift.

However, as soon as the neutral point voltage $U_n$ comprises a non-zero AC component, this may be taken as indication for a substantive non-uniform deterioration or failure within the cords 23 of the suspension member 11. In case of detecting such substantive deterioration or failure, the determination unit 29 may issue a signal for example to the elevator's 1 control device 18 in order to stop operation of the elevator 1.

Measuring the neutral point voltage $U_n$ and thereby monitoring the suspension member 11 for an occurrence of specific types of non-uniform deteriorations or failures may be performed continuously or repeatedly in short time intervals of e.g. some seconds, minutes or hours.

In same or substantially longer time intervals, the device 17 may measure the difference voltage $U_d$. Compared to the above mentioned non-uniform deteriorations, the uniform deteriorations to be detected by analyzing the difference voltage $U_d$ typically develop in longer time ranges of some days, weeks, months or even years such that it may be sufficient to measure the difference voltage $U_d$ in such longer time intervals.

While the difference voltage $U_d$ will generally have a certain non-zero alternating voltage component due to the phase shift of the applied first and second alternating voltages $U_1$, $U_2$, a specific degree or amplitude of such alternating voltage component may generally depend on an electrical resistance through the cords 23 comprised in the first and second groups 24a, 24b of cords.

Accordingly, while, in the method presented herein, no electrical resistances are measured directly but only voltages are measured, the degree or amplitude of the alternating voltage component comprised in the measured difference voltage $U_d$ may provide information about actual electrical resistances through the groups 24a, 24b of cords 23 in the suspension member 11. From such information, indications about the uniform deterioration state of the suspension member 11 may be derived. Particularly, information about a deterioration state resulting from homogeneous corrosion of all cords 23 in the suspension member 11 may be derived from the measured difference voltage $U_d$.

For example, the measured difference voltage $U_d$ may be compared to a reference difference voltage value $U_{dr}$ which correlates for example to a difference voltage $U_d$ which has been measured for example in a non-deteriorated state directly after installing the suspension member arrangement 9 and has then been stored in a memory e.g. of the determination unit 29.

In case the currently measured difference voltage $U_d$ differs from the reference difference voltage value $U_{dr}$ by more than a predetermined tolerance, for example by more than 2%, 5%, 10%, 20%, 30% or 40%, it may be assumed that excessive deterioration resulting in increased electrical resistance occurred in the cords 23 of the groups 24a, 24b of cords and the device 17 may go into an error mode in which e.g. the determination unit 29 sends a signal to the elevator's control device 18 for stopping or modifying the operation of the elevator 1.

It shall be noted that all measured or determined values, particularly all voltage values, indicated herein are understood by one skilled in the art as "substantial" values. I.e. when a measured or determined value is said to be a specific numeral value, insignificant deviations of e.g. up to 2% relative or even up to 5% relative may still be included. For example, if it is stated that no DC voltage and/or no AC voltage are measured this may mean that within acceptable tolerances no such voltages are measured but that for example due to noises some minor electric voltages may still occur.

Finally, it should be noted that terms such as "comprising" do not exclude other elements or steps and that terms such as "a" or "an" do not exclude a plurality. Also elements described in association with different embodiments may be combined.

In accordance with the provisions of the patent statutes, the present invention has been described in what is considered to represent its preferred embodiment. However, it should be noted that the invention can be practiced otherwise than as specifically illustrated and described without departing from its spirit or scope.

LIST OF REFERENCE SIGNS 1 elevator
3 car
5 counterweight
7 elevator shaft
9 suspension member arrangement
11 suspension member
13 traction machine
15 traction sheave
17 device for detecting deterioration states
18 control device
19 belt
21 matrix material
23 cords
24a first group of cords
24b second group of cords
25a first end of first group of cords
25b first end second group of cords
27a second end of first group of cords
27b second end second group of cords
29 determination unit
30 neutral point
31 first voltage measurement arrangement
32 voltage measurement arrangement
33 second voltage measurement arrangement
34 reference potential
35 neutral point voltage determining unit
35a first voltage determining unit
35b second voltage determining unit
35c third voltage determining unit 35d fourth voltage determining unit
36 pull-up voltage source
37a first AC voltage determining unit
37b first DC voltage determining unit
37c second voltage determining unit
38 center point
39a,b capacitors
40 differential voltage determining unit
41 faulty first connection to ground
41a,b switches
43 faulty second connection to ground
45 symmetrical short
47 asymmetrical short
49 PWM microcontroller
51 multiplexer arrangement
53a-d drivers
55a-d low pass filters
57 first difference measurement point
59 second difference measurement point
A-D voltage measurement arrangements
$U_1$ first alternating voltage
$U_2$ second alternating voltage
$U_3$ third alternating voltage
$U_4$ fourth alternating voltage
G alternating voltage generator arrangement
$G_1$ first alternating voltage generator
$G_2$ second alternating voltage generator
$U_{G1}$ first generated voltage
$U_{G2}$ second generated voltage
$U_+$ summed voltage
$U_-$ differential voltage
$U_{+,AC}$ alternating voltage component of the summed voltage U+
$U_{-,AC}$ alternating voltage component of the differential voltage U−
$U_{+,DC}$ direct voltage component of the summed voltage U+
$U_{-,DC}$ direct voltage component of the differential voltage U−
$U_n$ neutral point voltage
$U_d$ differential voltage
$U_{dr}$ reference difference voltage
$R_a$, $R_b$ first and second electrical resistors
$R_1$-$R_4$ electrical resistances
$R_5$ connecting electrical resistance
$R_6$, $R_7$ separate connecting electrical resistances
$t_1$-$t_6$ periods of time during multiplexing
$t_s$ sleep period

The invention claimed is:

1. A method for detecting non-uniform and uniform deterioration states in a suspension member arrangement for an elevator, the suspension member arrangement including a suspension member having first and second groups of electrically conductive cords, wherein first ends of the first and second groups are electrically connected to an alternating voltage generator arrangement including a first voltage generator for applying a first alternating voltage to the first end of the first group and a second voltage generator for applying a second alternating voltage to the first end of the second group, wherein second ends of the first and second groups are electrically connected to each other via a neutral point at which electrical resistances to the first voltage generator and to the second voltage generator, respectively, are of a same value in a non-deteriorated state of the suspension member, and wherein first and second electrical resistors are arranged between the neutral point and the second ends of the first and second groups respectively, the method comprising the steps of:

applying the first alternating voltage to the first end of the first group and applying the second alternating voltage to the first end of the second group;
determining a neutral point voltage between the neutral point and an electrical reference potential;
determining a difference voltage between a first difference measurement point, located between the second end of the first group and the first electrical resistor, and a second difference measurement point, located between the second end of the second group and the second electrical resistor; and
determining a deterioration state of the suspension member based on both the determined neutral point voltage and the determined difference voltage.

2. The method according to claim 1 wherein the determining of a deterioration state is based on a comparison of the difference voltage as currently determined with a reference difference voltage value.

3. The method according to claim 2 wherein the reference difference voltage value correlates to the difference voltage as measured in the non-deteriorated state of the suspension member.

4. The method according to claim 1 including indicating an excessive deterioration in the suspension member in response to a deviation from a state in which:
as a first criterion, the neutral point voltage does not include an alternating voltage component larger than a predetermined first tolerance; and
as a second criterion, the difference voltage differs from the reference difference voltage value by less than a predetermined second tolerance.

5. The method according to claim 4 wherein, in the second criterion, an amplitude of an alternating voltage component of the difference voltage shall differ from an amplitude of the reference difference voltage value by less than the predetermined second tolerance.

6. The method according to claim 1 wherein the first and second alternating voltages have same waveforms and a phase difference of substantially 180°.

7. The method according to claim 1 wherein an electrical resistance of a sum of the first and second electrical resistors is larger than an electrical resistance through each one of the first and second groups in the non-deteriorated state of the suspension member.

8. A device for detecting non-uniform and uniform deterioration states in a suspension member arrangement for an elevator, the suspension member arrangement including a suspension member having first and second groups of electrically conductive cords, the device comprising:
an alternating voltage generator arrangement including a first voltage generator adapted to apply a first alternating voltage to a first end of the first group and a second voltage generator adapted to apply a second alternating voltage to a first end of the second group; and
a voltage measurement arrangement including,
a circuitry adapted to electrically connect second ends of the first and second groups to each other via a neutral point at which electrical resistances to the first voltage generator and to the second voltage generator are a same value in a non-deteriorated state of the suspension member arrangement, and including first and second electrical resistors arranged between the neutral point and the second ends of the first and second groups respectively,
a neutral point voltage determining unit for determining neutral point voltages between the neutral point and an electrical reference potential, a difference voltage determining unit for determining a difference voltage between a first difference measurement point, located between the second end of the first group and the first electrical resistor, and a second difference measurement point, located between the second end of the second group and the second electrical resistor, and wherein an electrical resistance of a sum of the first and second electrical resistors is larger than an electrical resistance through each one of the first and second groups in the non-deteriorated state of the suspension member.

9. The device according to claim 8 including a determination unit for determining a deterioration state of the suspension member based on both the neutral point voltages and the difference voltage.

10. The device according to claim 8 wherein the device is adapted for performing the following method steps:

applying the first alternating voltage to the first end of the first group and applying the second alternating voltage to the first end of the second group;

determining the neutral point voltage between the neutral point and the electrical reference potential;

determining the difference voltage between the first difference measurement point and the second difference measurement point; and determining the deterioration state of the suspension member based on both the determined neutral point voltage and the determined difference voltage.

11. A device for detecting non-uniform and uniform deterioration states in a suspension member arrangement for an elevator, the suspension member arrangement including a suspension member having first and second groups of electrically conductive cords, the device comprising:

an alternating voltage generator arrangement including a first voltage generator adapted to apply a first alternating voltage to a first end of the first group and a second voltage generator adapted to apply a second alternating voltage to a first end of the second group;

a voltage measurement arrangement including, a circuitry adapted to electrically connect second ends of the first and second groups to each other via a neutral point at which electrical resistances to the first voltage generator and to the second voltage generator are a same value in a non-deteriorated state of the suspension member arrangement, and including first and second electrical resistors arranged between the neutral point and the second ends of the first and second groups respectively, a neutral point voltage determining unit for determining neutral point voltages between the neutral point and an electrical reference potential, and a difference voltage determining unit for determining a difference voltage between a first difference measurement point, located between the second end of the first group and the first electrical resistor, and a second difference measurement point, located between the second end of the second group and the second electrical resistor; and wherein the device is adapted for performing the following method steps:

applying the first alternating voltage to the first end of the first group and applying the second alternating voltage to the first end of the second group;

determining the neutral point voltage between the neutral point and the electrical reference potential;

determining the difference voltage between the first difference measurement point and the second difference measurement point; and determining the deterioration state of the suspension member based on both the determined neutral point voltage and the determined difference voltage.

* * * * *